(12) United States Patent
Contreras et al.

(10) Patent No.: US 11,302,645 B2
(45) Date of Patent: Apr. 12, 2022

(54) PRINTED CIRCUIT BOARD COMPENSATION STRUCTURE FOR HIGH BANDWIDTH AND HIGH DIE-COUNT MEMORY STACKS

(71) Applicant: Western Digital Technologies, Inc., San Jose, CA (US)

(72) Inventors: John Thomas Contreras, Palo Alto, CA (US); Sayed Mobin, San Jose, CA (US); Daniel Oh, San Jose, CA (US); Rehan Ahmed Zakai, San Ramon, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/916,784

(22) Filed: Jun. 30, 2020

(65) Prior Publication Data

US 2021/0407915 A1  Dec. 30, 2021

(51) Int. Cl.
 *H05K 1/00* (2006.01)
 *H05K 1/02* (2006.01)
 (Continued)

(52) U.S. Cl.
 CPC ...... *H01L 23/5386* (2013.01); *H01L 23/5383* (2013.01); *H01L 23/66* (2013.01);
 (Continued)

(58) Field of Classification Search
 CPC . H01L 23/5386; H01L 23/66; H01L 23/5383; H01L 24/48; H01L 25/18;
 (Continued)

(56) References Cited

U.S. PATENT DOCUMENTS 5,075,253 A   12/1991  Sliwa, Jr.
6,026,456 A    2/2000  Ilkbahar
(Continued)

FOREIGN PATENT DOCUMENTS

EP    1129520 B1    7/2003
JP   2011049412 A   3/2011
(Continued)

OTHER PUBLICATIONS

Altera, "Basic Principles of Signal Integrity", white paper, Altera Corporation, 2007.
(Continued)

*Primary Examiner* — Xiaoliang Chen
(74) *Attorney, Agent, or Firm* — Patterson & Sheridan, LLP; Steven Versteeg

(57) ABSTRACT

A circuit interconnect for high bandwidth and high die-count memory stacks. The circuit interconnect may include a first ground trace, a first signal trace, a second ground trace, and a second signal trace. The first ground trace may reside in a first layer of a multilayer printed circuit board. The first signal trace may be positioned adjacent to the first ground trace within the first layer. The second ground trace may reside within a second layer of the multilayer printed circuit board. The second signal trace may be positioned adjacent to the second ground trace within the second layer.

17 Claims, 16 Drawing Sheets

(51) Int. Cl.
| | |
|---|---|
| *H05K 1/11* | (2006.01) |
| *H05K 1/14* | (2006.01) |
| *H05K 3/46* | (2006.01) |
| *H01L 23/66* | (2006.01) |
| *H01L 23/538* | (2006.01) |
| *H01L 25/18* | (2006.01) |
| *H01L 23/00* | (2006.01) |

(52) U.S. Cl.
CPC .............. *H01L 24/48* (2013.01); *H01L 25/18* (2013.01); *H01L 2224/48145* (2013.01); *H01L 2224/48227* (2013.01)

(58) Field of Classification Search
CPC . H01L 2224/48145; H01L 2224/48227; H01L 23/3436; H01L 23/5222; H01L 23/5384; H01L 23/49838; H01L 24/49; H01L 25/0655; H01L 25/0657; H05K 1/00; H05K 1/02; H05K 1/11; H05K 1/14; H05K 1/115; H05K 3/46; H05K 3/4644
USPC .................. 361/777, 767; 174/262, 266, 728
See application file for complete search history.

(56) References Cited

U.S. PATENT DOCUMENTS

| | | | |
|---|---|---|---|
| 6,246,112 B1* | 6/2001 | Ball | H01L 23/49822 257/690 |
| 6,356,106 B1 | 3/2002 | Greeff et al. | |
| 6,444,922 B1* | 9/2002 | Kwong | H05K 1/14 174/255 |
| 6,514,794 B2 | 2/2003 | Haba et al. | |
| 6,621,155 B1 | 9/2003 | Perino et al. | |
| 7,005,939 B2 | 2/2006 | Zerbe et al. | |
| 7,795,905 B2 | 9/2010 | Sohn | |
| 8,093,954 B1 | 1/2012 | Lombaard | |
| 8,415,808 B2 | 4/2013 | Liao et al. | |
| 8,688,955 B2 | 4/2014 | Grunzke | |
| 8,929,119 B2 | 1/2015 | Lee et al. | |
| 8,930,647 B1 | 1/2015 | Smith | |
| 9,245,825 B2 | 1/2016 | Ramachandra et al. | |
| 9,268,719 B2 | 2/2016 | Shaeffer | |
| 9,432,298 B1 | 8/2016 | Smith | |
| 10,270,441 B2 | 4/2019 | Nguyen et al. | |
| 10,283,200 B2* | 5/2019 | Hermesh | G11C 7/1084 |
| 10,468,073 B2* | 11/2019 | Contreras | H01L 25/0657 |
| 10,637,533 B2 | 4/2020 | Contreras et al. | |
| 10,643,676 B2 | 5/2020 | Mobin et al. | |
| 2003/0190849 A1 | 10/2003 | Deas et al. | |
| 2004/0034751 A1 | 2/2004 | Horn et al. | |
| 2004/0137542 A1 | 7/2004 | Petyaev | |
| 2005/0285262 A1 | 12/2005 | Knapp et al. | |
| 2006/0091900 A1 | 5/2006 | Kang et al. | |
| 2006/0138650 A1* | 6/2006 | Hidalgo | H01L 24/49 257/728 |
| 2006/0158280 A1* | 7/2006 | Jow | H05K 1/0251 333/33 |
| 2006/0258187 A1* | 11/2006 | Behziz | H05K 1/0251 439/77 |
| 2007/0035900 A1 | 2/2007 | Huber et al. | |
| 2008/0030286 A1 | 2/2008 | Park et al. | |
| 2008/0032446 A1 | 2/2008 | Wood | |
| 2009/0206962 A1 | 8/2009 | Chou | |
| 2009/0303768 A1* | 12/2009 | Nishio | G06F 13/4072 365/51 |
| 2010/0136835 A1 | 6/2010 | Hashim et al. | |
| 2010/0327902 A1 | 12/2010 | Shau | |
| 2012/0032684 A1 | 2/2012 | Siddiquie | |
| 2012/0256318 A1* | 10/2012 | Sawada | H01L 23/66 257/773 |
| 2013/0031326 A1 | 1/2013 | Grunzke | |
| 2013/0199834 A1* | 8/2013 | De Geest | H05K 1/024 174/266 |
| 2014/0002188 A1 | 1/2014 | Chen | |
| 2014/0008796 A1 | 1/2014 | Choi | |
| 2014/0036471 A1 | 2/2014 | Yuen et al. | |
| 2014/0071646 A1* | 3/2014 | Qian | H05K 1/0228 361/777 |
| 2014/0177189 A1 | 6/2014 | Liu et al. | |
| 2014/0192583 A1 | 7/2014 | Rajan et al. | |
| 2014/0218998 A1 | 8/2014 | Park | |
| 2015/0061157 A1 | 3/2015 | Yu et al. | |
| 2015/0195906 A1* | 7/2015 | Chang | H01L 23/49838 361/767 |
| 2015/0279444 A1 | 10/2015 | Vergis et al. | |
| 2016/0085899 A1* | 3/2016 | Qian | H01L 23/5381 257/774 |
| 2017/0098469 A1 | 4/2017 | Park | |
| 2017/0271735 A1* | 9/2017 | Kagaya | H01P 5/028 |
| 2018/0018294 A1 | 1/2018 | Park et al. | |
| 2018/0026634 A1 | 1/2018 | Park et al. | |
| 2018/0145054 A1* | 5/2018 | Kim | H01L 25/0655 |
| 2018/0261286 A1 | 9/2018 | Hermesh | |
| 2018/0332707 A1* | 11/2018 | Akahoshi | H01G 4/33 |
| 2019/0050352 A1 | 2/2019 | Yun et al. | |
| 2019/0206450 A1 | 7/2019 | Contreras | |
| 2019/0237417 A1* | 8/2019 | Dobbins | H01L 23/5222 |
| 2020/0065270 A1 | 2/2020 | Mobin et al. | |
| 2020/0098728 A1 | 3/2020 | Xing et al. | |
| 2020/0105318 A1 | 4/2020 | Mobin et al. | |
| 2020/0106478 A1 | 4/2020 | Contreras et al. | |
| 2020/0176905 A1* | 6/2020 | Buck | H01R 12/737 |

FOREIGN PATENT DOCUMENTS

| | | |
|---|---|---|
| JP | 4921937 B2 | 4/2012 |
| KR | 20120011831 A | 2/2012 |
| WO | 2004100263 A2 | 11/2004 |

OTHER PUBLICATIONS

Banas, David, Using Digitally Controlled Impedance: Signal Integrity vs. Power Dissipation Considerations, Xilinx Application note XAPP836, Jun. 1, 2007, Entire Document.

Harkness, Samuel, Jeffrey Meirhofer, and Brock J. LaMeres, Controlled Impedance Chip-to-Chip Interconnect Using Coplanar Wire Bond Structures, Department of Electrical and Computer Engineering, Montana State University, Bozeman, MT.

M. Facchini et al., "System-level power/performance evaluation of 3D stacked DRAMs for mobile applications," 2009 Design, Automation & Test in Europe Conference & Exhibition, Nice, 2009, pp. 923-928.

Mechaik, Mehdi M., An Evaluation of Single-Ended and Differential Impedance in PCBs, IEEE, 2001, pp. 301-306 Feb. 1, 2001.

Raghavan, G. White Paper: Five Emerging DRAM Interfaces You Should Know for your Next Design. Cadence Design Systems, White Paper. Retrieved from the Internet.

Wadell, "Introduction to Common Printed Circuit Transmission Lines", Application note 2093, Jun. 29, 2003, Maxim Integrated Products.

Office Action dated Jun. 28, 2021 in Korean Patent Application No. 10-2019-0065456, 17 pages.

\* cited by examiner

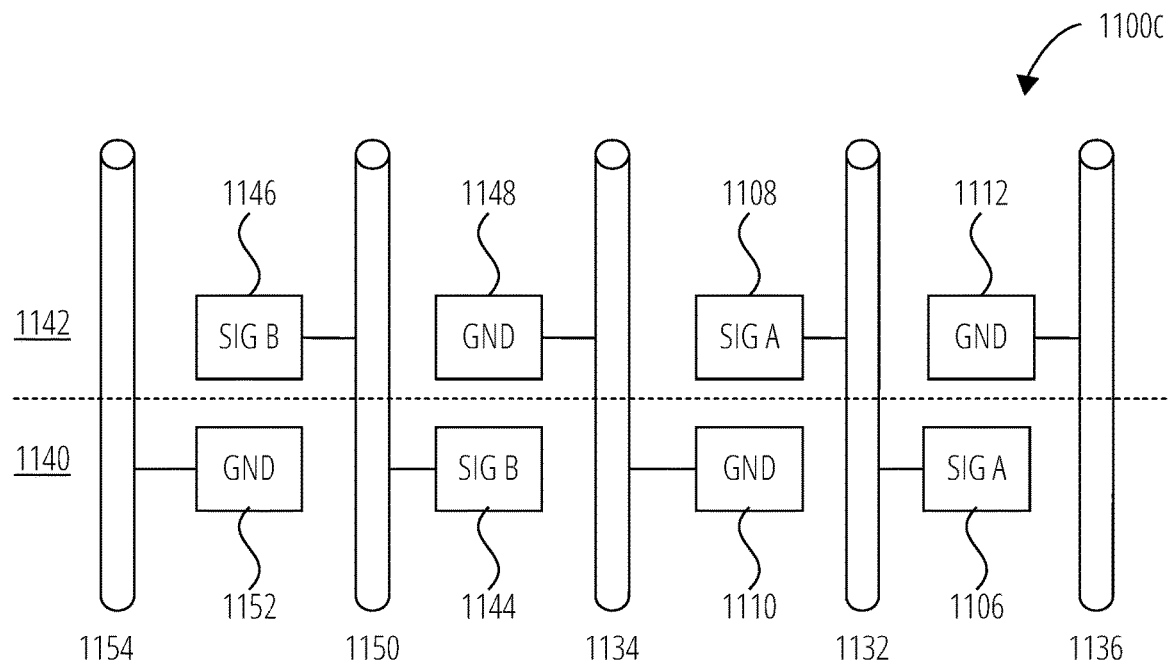
FIG. 11C
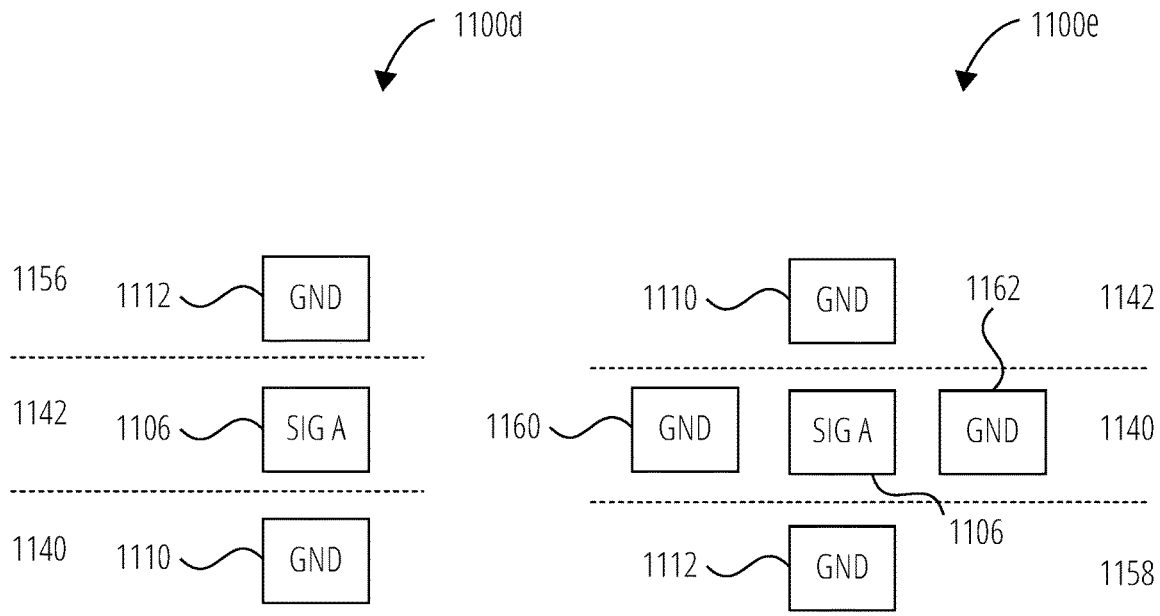
FIG. 11D
FIG. 11E

PRINTED CIRCUIT BOARD COMPENSATION STRUCTURE FOR HIGH BANDWIDTH AND HIGH DIE-COUNT MEMORY STACKS

CROSS-REFERENCE TO RELATED APPLICATIONS AND PATENTS

This application relates to U.S. Pat. No. 10,468,073 filed Dec. 29, 2017, U.S. Pat. No. 10,637,533 filed Sep. 28, 2018, US Published application No. 20200098728A1 filed Sep. 26, 2018, U.S. Pat. Nos. 10,643,676, and 10,283,200 filed Mar. 8, 2017.

BACKGROUND

High speed communication buses incur transmission line effects like reflectance. Multiple senders and receivers along the transmission path increase the locations for signal reflection. Termination circuits, such as on-die termination circuits (resistive/active) reduce reflections along the transmission paths encountered by high speed signals.

High frequency and high bandwidth are difficult to achieve on a multidrop bus because of impedance mismatching and reflectance, which degrades signal integrity. Impedances of the source/transmitter/driver, the transmission line, and the receiver may be mismatched. At every point of impedance mismatch, reflection effects may occur, resulting in signal energy dissipation as the signal becomes noisy. This reduction in signal quality may limit the signal speed and bandwidth that may be achieved.

As memory die counts and memory interface speeds increase, the need for improved signal performance in spite of the addition of more potentially reflective nodes along the transmission path may increase as well. There is, therefore, a need to reduce impedance along the transmission path in a manner that also reduces reflections at signaling nodes. In this manner, signal speed and quality may be improved along high speed communication buses used in storage devices and other electronic devices.

BRIEF SUMMARY

This disclosure relates to a circuit interconnect for implementing printed circuit board signal compensation structures for high bandwidth and die-count memory stacks. The circuit interconnect may comprise a first ground trace, a first signal trace, a second ground trace, and a second signal trace. The first ground trace may reside in a first layer of a multilayer printed circuit board. The first signal trace may be positioned adjacent to the first ground trace within the first layer. The second ground trace may reside within a second layer of the multilayer printed circuit board. The second signal trace may be positioned adjacent to the second ground trace within the second layer.

This disclosure further relates to a system implementing printed circuit board signal compensation structures for high bandwidth and die-count memory stacks. The system may comprise a multilayer printed circuit board, a signal compensation structure, a storage controller, a die stack, and a communication bus. The signal compensation structure may be integrated with the multilayer printed circuit board. The signal compensation structure may comprise a first signal trace coupled to a first signal source and two ground traces coupled to a ground source. The storage controller may couple to the multilayer printed circuit board and may be configured to read from, and write data to, a set of memory dies. The die stack may couple to the multilayer printed circuit board and may comprise a set of memory dies connected to each other by a wire bond. The communication bus may connect the set of memory dies to the storage controller by way of the signal compensation structure.

Finally, this disclosure relates to a signal compensation structure for high bandwidth and die-count memory stacks. The signal compensation structure may comprise a first ground trace, a first signal trace, a second ground trace, and a second signal trace. The first ground trace may couple to a lower ground plane of a multilayer printed circuit board through a first ground via. The multilayer printed circuit board may comprise a substrate, a first layer, a second layer positioned above the first layer, the lower ground plane, and an upper ground plane. An insulation layer may separate the lower ground plane from the first layer, the first layer and the second layer, and the second layer and the upper ground plane. The first signal trace may be positioned adjacent to the first ground trace within the first layer and coupled to a signal source. The second ground trace may couple to the upper ground plane through a second ground via. The second signal trace may be positioned adjacent to the second ground trace within the second layer and may couple to the signal source through a source via connected to the first signal trace.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 11C illustrates a cross-section view of a signal compensation structure 1100c in accordance with one embodiment.

FIG. 11D illustrates a cross-section view of a signal compensation structure 1100d in accordance with one embodiment.

FIG. 11E illustrates a cross-section view of a signal compensation structure 1100e in accordance with one embodiment.

DETAILED DESCRIPTION

Figure 1:
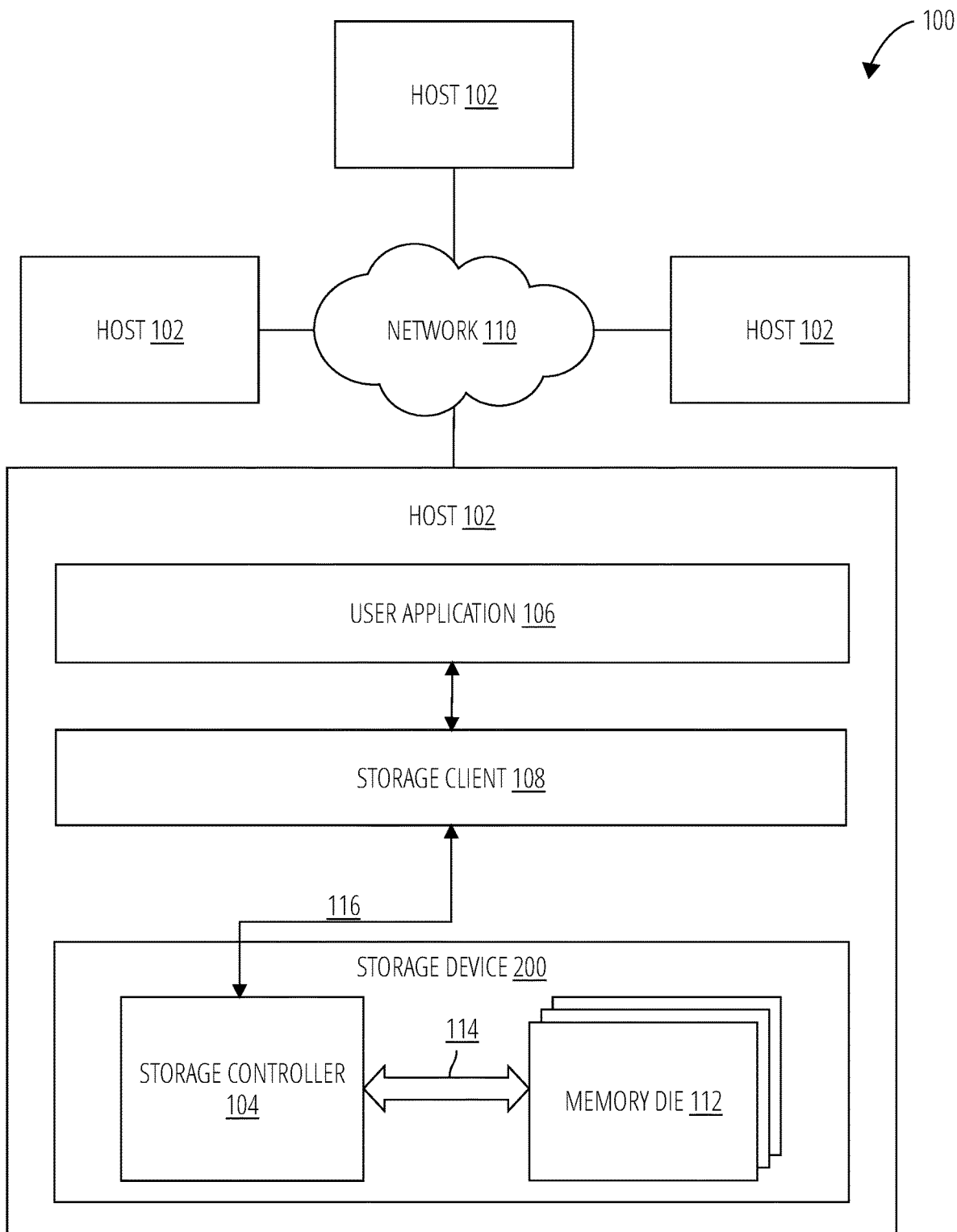
FIG. 1 illustrates a storage system 100 in accordance with one embodiment.

In order to improve signal speed and quality, disclosed herein are a number of signal and ground trace configurations comprising a signal compensation structure. "Signal compensation structure" refers to a structure configured, designed, arranged, engineered, or programmed to compensate for impedance mismatch, reflectance, characteristic impedance, parasitic capacitance, and/or the like in a transmission line or transmission path. "Trace" refers to a conductive structure configured to convey an electric signal between a sending component and a receiving component. A trace may be made of a variety of conductive materials. A common material used for a trace is copper. A trace may also be referred to interchangeably herein as a stripline or microstrip.

"Signal trace" refers to a structure configured to conduct an electronic signal between a sender/transmitter and a receiver. In one embodiment, the signal trace is bi-directional and configured to conduct an electronic signal between a sender/transmitter and a receiver when operating in one mode and to conduct an electronic signal in an opposite direction from the receiver to the sender when operating in another mode. When the electronic signal is conducted in the opposite direction, a sender may become the receiver and a receiver may become the sender. The electrical signal path can be treated as a transmission line when the electronic signal frequency's wavelength is within 10 times or smaller than the physical length of the transmission path, where the signal's wavelength is related to the speed of light (v) divided by the signal frequency (f). Transmission line systems are managed with signal termination and can have dependencies (e.g., signal reflection, characteristic impedance, inductance, timing delays, overshoot/undershoot, crosstalk interference, EMI radiation, and the like) in relation to the transmission line itself or a transmission path that includes the transmission line.

A signal trace may include one or more structures or active electrical components or passive electrical components along the length of the signal trace. In certain embodiments, such structures or active electrical components or passive electrical components may be a part of the signal trace. In certain embodiments, a signal trace may comprise one implementation of a control line. A trace may function as a signal carrying signal trace or as a ground path structure as a ground trace.

"Ground trace" refers to structure configured to conduct an electronic signal to a ground source (also referred to simply as 'ground'). A ground trace may include one or more structures or electrical components along the length of the ground trace. In certain embodiments, such structures or electrical components may be a part of the ground trace.

Signal and ground traces may be configured within a multilayer printed circuit board such that they run physically parallel to each other as they traverse the board. A single signal may be split across multiple traces in some embodiments to achieve a desired impedance, as well as a desired transmission line behavior when operating in conjunction with adjacent ground traces and ground planes. "Impedance" refers to a measure of the opposition that a circuit presents to a current when a voltage is applied.

Quantitatively, the impedance of a two-terminal circuit element is the ratio of the complex representation of the sinusoidal voltage between its terminals, to the complex representation of the current flowing through the circuit. In general, impedance depends upon the frequency of the sinusoidal frequency. (Search "impedance" on Wikipedia.com May 31, 2020. Modified. Accessed Jun. 2, 2020.)

The characteristic impedance (Zo) of a transmission line is the square root of the ratio of the distributed inductance (henries per unit length) over the distributed capacitance (farads per unit length), and the impedance of the transmission line is real impedance in SI units of ohm. These configurations of layers and traces may form the signal compensation structures disclosed herein, and may achieve a lower impedance transmission line (e.g., less than 40 ohms) when compared to conventional printed circuit board trace configurations, which typically incur about 50 ohms of impedance.

FIG. 1 is a schematic block diagram illustrating one embodiment of a storage system 100 that includes a storage device in accordance with the disclosed solution. The storage system 100 comprises a storage device 200, a storage controller 104, a memory die 112, at least one host 102, a user application 106, a storage client 108, a data bus 116, a bus 114, and a network 110. The storage system 100 includes at least one storage device 200, comprising a storage controller 104 and one or more memory dies 112, connected by a bus 114.

"Storage controller" refers to any hardware, device, component, element, or circuit configured to manage data operations on memory media (non-volatile and/or volatile), and may comprise one or more processors, programmable processors (e.g., FPGAs), ASICs, micro-controllers, or the like. In some embodiments, the storage controller is configured to store data on and/or read data from memory media (non-volatile and/or volatile), to transfer data to/from the non-volatile memory device(s), and so on.

"Memory die" refers to a small block of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die. (Search 'die (integrated circuit)' on Wikipedia.com Oct. 9, 2019. Accessed Nov. 18, 2019.) A memory die is a die, in one embodiment, that includes a functional circuit for operating as a memory media and/or a memory array. The memory media and/or memory array may comprise one or more of non-volatile memory media and volatile memory media.

"memory array" refers to a set of storage cells (also referred to as memory cells, volatile memory cells, or non-volatile memory cells) organized into an array structure having rows and columns. A memory array is addressable using a row identifier and a column identifier.

In some embodiments, each storage device 200 may include two or more memory dies 112, such as flash memory, nano random-access memory ("nano RAM or NRAM"), magneto-resistive RAM ("MRAM"), dynamic RAM ("DRAM"), phase change RAM ("PRAM"), etc. In further embodiments, the data storage device 200 may include other types of non-volatile and/or volatile data storage, such as dynamic RAM ("DRAM"), static RAM ("SRAM"), magnetic data storage, optical data storage, and/or other data storage technologies.

The storage device 200 may be a component within a host 102 as depicted in here, and may be connected using a data bus 116, such as a peripheral component interconnect express ("PCI-e") bus, a Serial Advanced Technology Attachment ("serial ATA") bus, or the like. In another embodiment, the storage device 200 is external to the host 102 and is connected, a universal serial bus ("USB") connection, an Institute of Electrical and Electronics Engineers ("IEEE") 1394 bus ("FireWire"), or the like. In other embodiments, the storage device 200 is connected to the host 102 using a peripheral component interconnect ("PCI") express bus using external electrical or optical bus extension or bus networking solution such as InfiniBand or PCI Express Advanced Switching ("PCIe-AS"), or the like.

In various embodiments, the storage device 200 may be in the form of a dual-inline memory module ("DIMM"), a daughter card, or a micro-module. In another embodiment, the storage device 200 is a component within a rack-mounted blade. In another embodiment, the storage device 200 is contained within a package that is integrated directly onto a higher-level assembly (e.g., mother board, laptop, graphics processor). In another embodiment, individual components comprising the storage device 200 are integrated directly onto a higher-level assembly without intermediate packaging. The storage device 200 is described in further detail with regard to FIG. 2.

In a further embodiment, instead of being connected directly to the host 102 as DAS, the data storage device 200 may be connected to the host 102 over a data network. For example, the data storage device 200 may include a storage area network ("SAN") storage device, a network attached storage ("NAS") device, a network share, or the like. In one embodiment, the storage system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host 102 and the data storage device 200.

The storage system 100 includes at least one host 102 connected to the storage device 200. Multiple hosts 102 may be used and may comprise a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a host 102 may be a client, and the storage device 200 may operate autonomously to service data requests sent from the host 102. In this embodiment, the host 102 and storage device 200 may be connected using a computer network, system bus, Direct Attached Storage (DAS), or other communication means suitable for connection between a computer and an autonomous storage device 200.

The depicted embodiment shows a user application 106 in communication with a storage client 108 as part of the host 102. In one embodiment, the user application 106 is a software application operating on or in conjunction with the storage client 108.

The storage client 108 manages files and data and utilizes the functions and features of the storage controller 104 and associated memory dies 112. Representative examples of storage clients include, but are not limited to, a server, a file system, an operating system, a database management system ("DBMS"), a volume manager, and the like. The storage client 108 is in communication with the storage controller 104 within the storage device 200. In some embodiments, the storage client 108 may include remote storage clients operating on hosts 102 or otherwise accessible via the network 110. Storage clients may include, but are not limited to operating systems, file systems, database applications, server applications, kernel-level processes, user-level processes, applications, and the like.

In one embodiment, the storage system 100 includes one or more clients connected to one or more hosts 102 through one or more computer networks 110. A host 102 may be a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The network 110 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The network 110 may also include a network from the IEEE 802 family of network technologies, such Ethernet, token ring, WiFi, WiMax, and the like.

The network 110 may include servers, switches, routers, cabling, radios, and other equipment used to facilitate networking the host 102 or hosts 102 and clients. In one embodiment, the storage system 100 includes multiple hosts 102 that communicate as peers over a network 110. In another embodiment, the storage system 100 includes multiple storage devices 200 that communicate as peers over a network 110. One of skill in the art will recognize other computer networks comprising one or more computer networks and related equipment with single or redundant connection between one or more clients or other computer with one or more storage devices 200 connected to one or more hosts. In one embodiment, the storage system 100 includes two or more storage devices 200 connected through the network 110 to a remote host 102, without being directly connected to or integrated within a local host 102.

In one embodiment, the storage client 108 communicates with the storage controller 104 through a host interface comprising an Input/Output (I/O) interface. For example, the storage device 200 may support the ATA interface standard, the ATA Packet Interface ("ATAPI") standard, the small computer system interface ("SCSI") standard, and/or the Fibre Channel standard which are maintained by the Inter-National Committee for Information Technology Standards ("INCITS").

In certain embodiments, the storage media of a memory device is divided into volumes or partitions. Each volume or partition may include a plurality of sectors. Traditionally, a sector is 512 bytes of data. One or more sectors are organized into a block (referred to herein as both block and data block, interchangeably).

In one example embodiment, a data block includes eight sectors which is 4 KB. In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or data block or cluster represents a smallest physical amount of storage space on the storage media that is managed by a storage manager, such as a storage controller, storage system, storage unit, storage device, or the like.

In some embodiments, the storage controller 104 may be configured to store data on one or more asymmetric, write-once storage media, such as solid-state storage memory cells within the memory die 112. The memory die 112 may be partitioned into memory divisions that can be erased as a group (e.g., erase blocks) in order to, inter alia, account for the asymmetric properties of the memory die 112 or the like. As such, modifying a single data segment in-place may involve erasing the entire erase block comprising the data, and rewriting the modified data to the erase block, along with the original, unchanged data. This may result in inefficient write amplification, which may excessively wear the memory die 112.

Therefore, in some embodiments, the storage controller 104 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many operations, including storage operations (e.g., the erasure latency is no longer part of the main path of a write operation). Management of a data block by a storage manager includes specifically addressing a particular data block for a read operation, write operation, or maintenance operation.

A block storage device may associate n blocks available for user data storage across the storage media with a logical address, numbered from 0 to n. In certain block storage devices, the logical addresses may range from 0 to n per volume or partition. In conventional block storage devices, a logical address maps directly to a particular data block on physical storage media. In conventional block storage devices, each data block maps to a particular set of physical sectors on the physical storage media. However, certain storage devices do not directly or necessarily associate logical addresses with particular physical data blocks. These storage devices may emulate a conventional block storage interface to maintain compatibility with a block storage client 108.

In one embodiment, the storage controller 104 provides a block I/O emulation layer, which serves as a block device interface, or API. In this embodiment, the storage client 108 communicates with the storage device through this block device interface. In one embodiment, the block I/O emulation layer receives commands and logical addresses from the storage client 108 in accordance with this block device interface. As a result, the block I/O emulation layer provides the storage device compatibility with a block storage client 108.

In one embodiment, a storage client 108 communicates with the storage controller 104 through a host interface comprising a direct interface. In this embodiment, the storage device directly exchanges information specific to non-volatile storage devices. A storage device using direct interface may store data in the memory die 112 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die 112.

The storage controller 104 receives a logical address and a command from the storage client 108 and performs the corresponding operation in relation to the memory die 112. The storage controller 104 may support block I/O emulation, a direct interface, or both.

Figure 2:
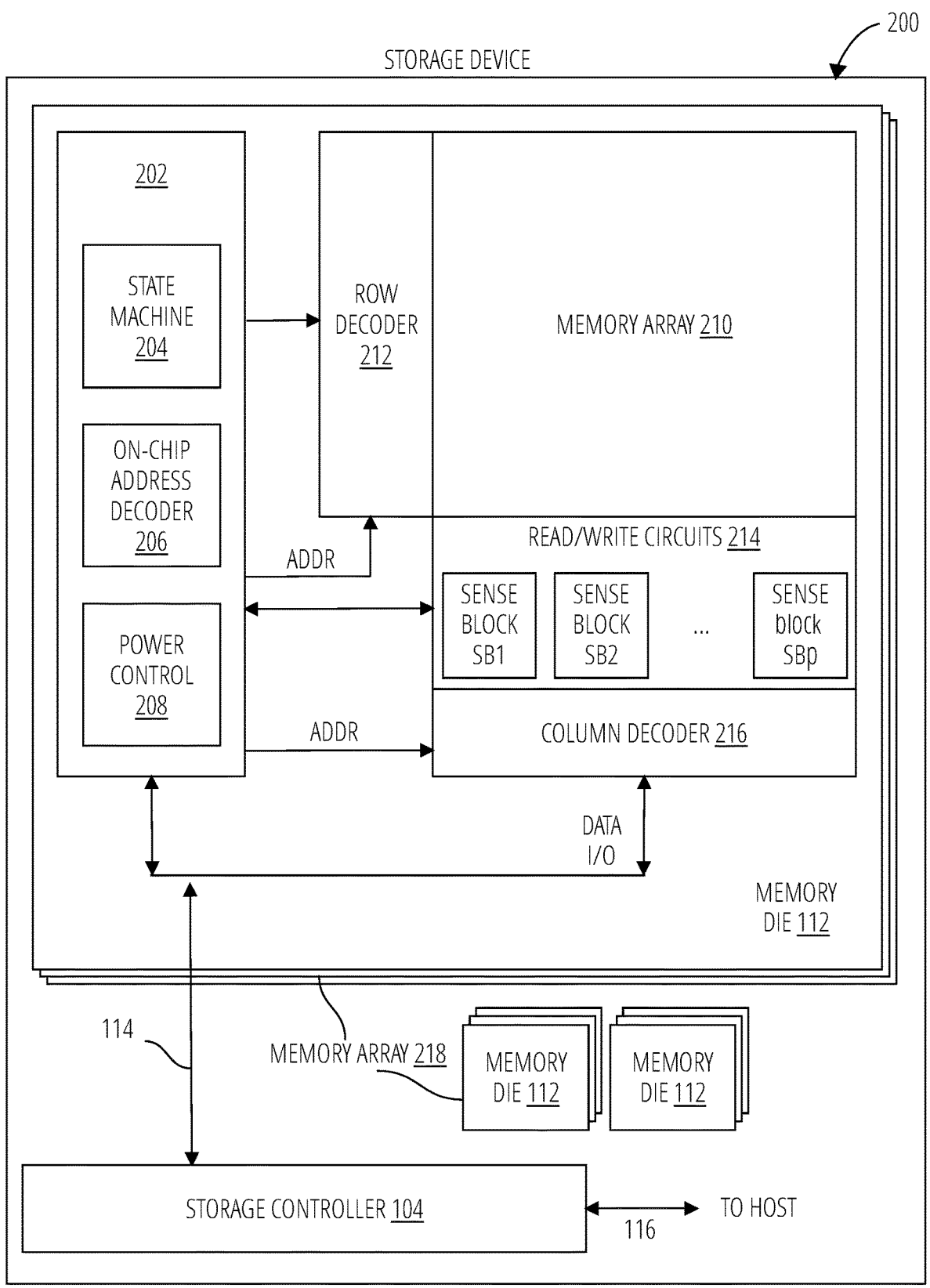
FIG. 2 illustrates a storage device 200 in accordance with one embodiment.

FIG. 2 is a block diagram of an exemplary storage device 200. The storage device 200 may include a storage controller 104 and a memory array 218. Each memory die 112 in the memory array 218 may include a die controller 202, at least one non-volatile memory array 210 in the form of a three-dimensional array and read/write circuits 214.

"Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components.

The non-volatile memory array 210 is addressable by word line via a row decoder 212 and by bit line via a column decoder 216. The read/write circuits 214 include multiple sense blocks SB1, SB2, SBp (sensing circuitry) and allow a page of memory cells to be read or programmed in parallel. In certain embodiments, each memory cell across a row of the memory array together form a physical page. A physical page may include memory cells along a row of the memory array for a single plane or for a single memory die. In one embodiment, the memory die includes a memory array made up of two equal sized planes. In one embodiment, a physical page of one plane of a memory die includes four data blocks (e.g., 16 KB). In one embodiment, a physical page (also called a "die page") of a memory die includes two planes each having four data blocks (e.g., 32 KB).

Commands and data are transferred between the host 102 and storage controller 104 via a data bus 116, and between the storage controller 104 and the one or more memory dies 112 via bus 114. The storage controller 104 may comprise the logical modules described in more detail with respect to FIG. 1.

The non-volatile memory array 210 can be two-dimensional (2D—laid out in a single fabrication plane) or three-dimensional (3D—laid out in multiple fabrication planes). The non-volatile memory array 210 may comprise one or more arrays of memory cells including a 3D array. In one embodiment, the non-volatile memory array 210 may comprise a monolithic three-dimensional memory structure (3D array) in which multiple memory levels are formed above (and not in) a single substrate, such as a wafer, with no intervening substrates. The non-volatile memory array 210 may comprise any type of non-volatile memory that is monolithically formed in one or more physical levels of arrays of memory cells having an active area disposed above a silicon substrate. The non-volatile memory array 210 may be in a non-volatile solid-state drive having circuitry associated with the operation of the memory cells, whether the associated circuitry is above or within the substrate.

Word lines may comprise sections of the layers containing memory cells, disposed in layers above the substrate. Multiple word lines may be formed on single layer by means of trenches or other non-conductive isolating features.

The die controller 202 cooperates with the read/write circuits 214 to perform memory operations on memory cells of the non-volatile memory array 210, and includes a state machine 204, an address decoder 206, and a power control 208. The state machine 204 provides chip-level control of memory operations.

The address decoder 206 provides an address interface between that used by the host or a storage controller 104 to the hardware address used by the row decoder 212 and column decoder 216. The power control 208 controls the power and voltages supplied to the various control lines during memory operations.

The power control 208 and/or read/write circuits 214 can include drivers for word lines, source gate select (SGS) transistors, drain gate select (DGS) transistors, bit lines, substrates (in 2D memory structures), charge pumps, and source lines. In certain embodiments, the power control 208 may detect a sudden loss of power and take precautionary actions. The power control 208 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than non-volatile memory array 210, can be thought of as at least one control circuit or storage controller which is configured to perform the techniques described herein. For example, a control circuit may include any one of, or a combination of, die controller 202, state machine 204, address decoder 206, column decoder 216, power control 208, sense blocks SB1, SB2, SBp, read/write circuits 214, storage controller 104, and so forth.

In one embodiment, the host 102 is a computing device (e.g., laptop, desktop, smartphone, tablet, digital camera) that includes one or more processors, one or more processor readable storage devices (RAM, ROM, FLASH memory, hard disk drive, solid state memory) that store processor readable code (e.g., software) for programming the storage controller 104 to perform the methods described herein. The host may also include additional system memory, one or more input/output interfaces and/or one or more input/output devices in communication with the one or more processors, as well as other components well known in the art.

Associated circuitry is typically involved in operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 3:
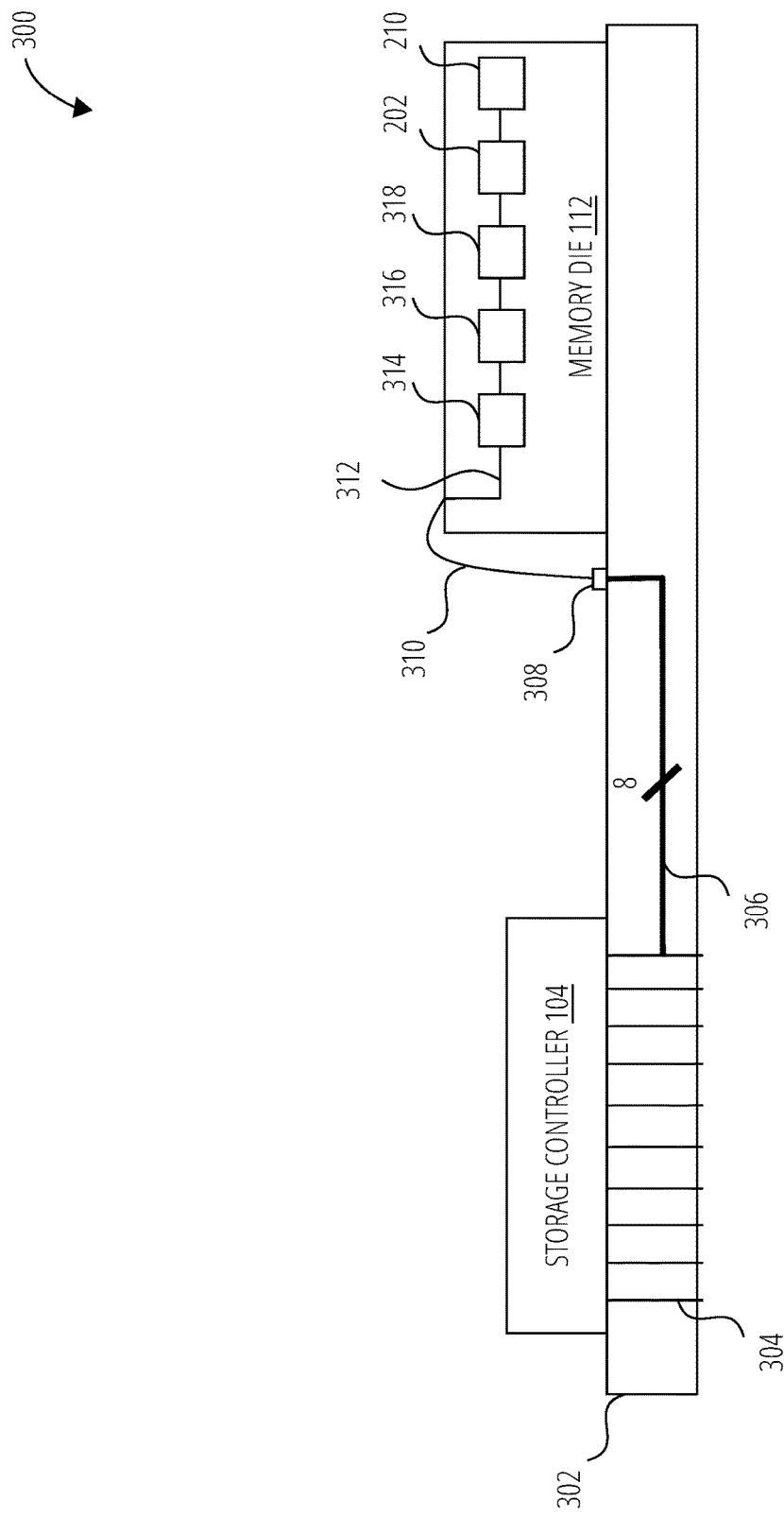
FIG. 3 illustrates a lateral cross-section view of a storage device 300 mounted to a multilayer printed circuit board.

FIG. 3 illustrates a storage device 300 at a high level. A storage controller 104 may attach or couple to a printed circuit board substrate 302. This may be accomplished using pins 304 that protrude through the printed circuit board substrate 302. The pins 304 may connect to signal traces that form a communication bus 306. "Pin" refers to a conductive structure for connecting electrical components of a semiconductor component and/or chip to a bonding pad. A pin may comprise a thin cylindrical structure often made of metal. In other embodiments, a pin may be implemented as a spherical or semi-spherical structure also referred to as a ball.

Figure 4:
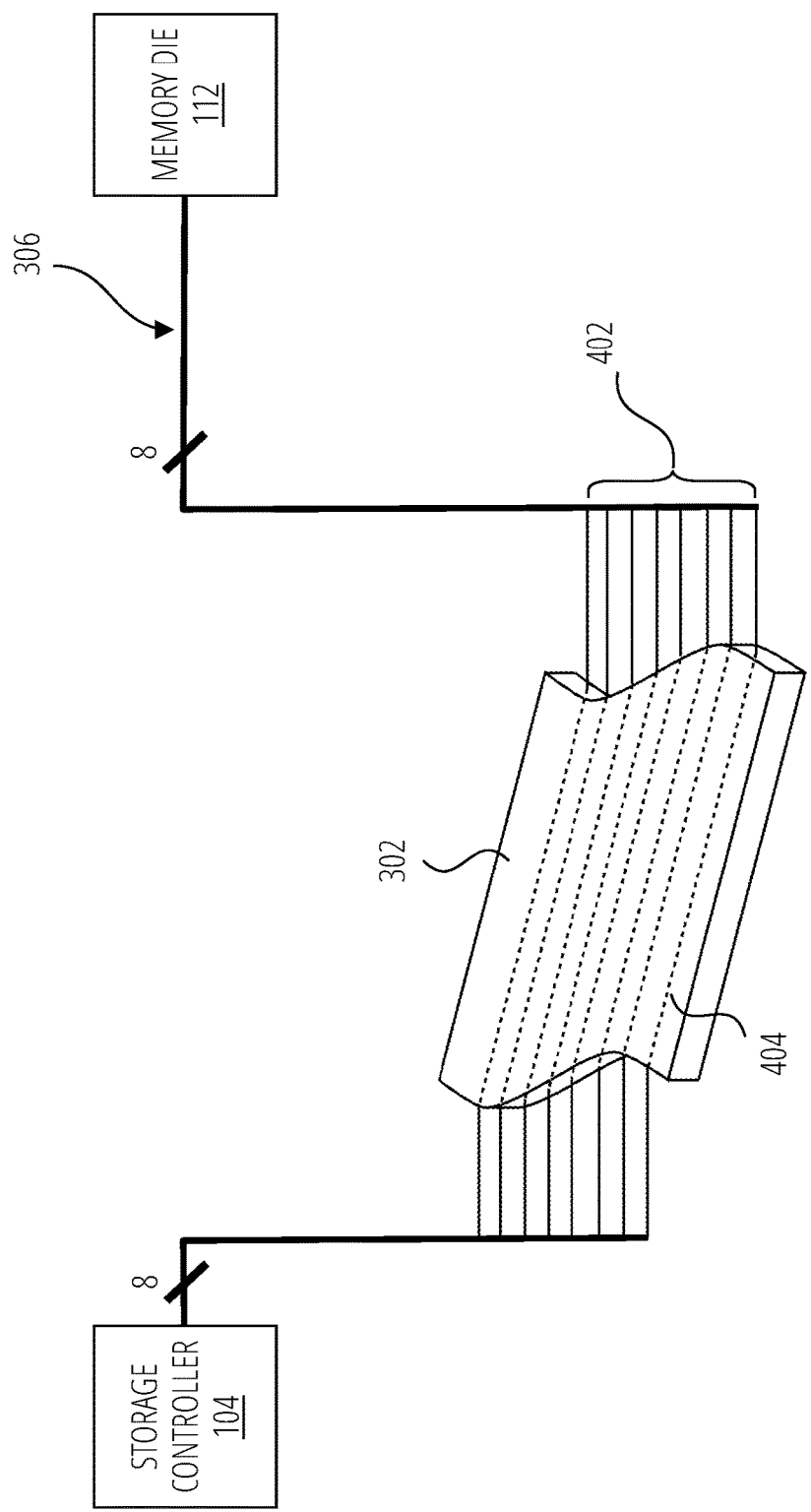
FIG. 4 illustrates a portion of communication bus 306 in accordance with one embodiment.

The communication bus 306 may be an 8-bit bus as indicated and may run through the printed circuit board substrate 302 by way of transmission lines, as indicated in FIG. 4. The signals of the communication bus 306 may connect to a bonding pad 308 on the surface of the printed circuit board substrate 302. "Bonding pad" refers to a conductive structure for connecting a trace and a wire bond or pin for an electrical connection.

A wire bond 310 transfers a signal from the printed circuit board substrate 302 to the memory die 112 as shown. "Wire bond" refers to a wire, often made of aluminum, alloyed aluminum, copper, silver, gold or doped gold, for interconnection of integrated circuits, communication buses and/or communication channels.

Once a control line 312 signal from the communication bus 306 is connected to the memory die 112, control line 312 signal may connect to an electrostatic discharge (ESD) protection circuit. The ESD protection circuit 314 may protect circuitry within the memory die 112 from harmful electrostatic discharges. The ESD circuits can add a significant amount of parasitic capacitance that has to be compensated for by the terminations and/or Printed circuit board (PCB) compensation structure.

In addition to the ESD protection circuit 314, the control line may connect to an electrical termination circuit 316 circuit. "Electrical termination" refers to the practice of ending a transmission line with a device that matches the characteristic impedance of the line. This is intended to prevent signals from reflecting at the end of the transmission line. Reflections at the ends of unterminated transmission lines cause distortion which can produce ambiguous digital signal levels and mis-operation of digital systems. (Search "electrical termination" on Wikipedia.com Jul. 23, 2018. Modified. Accessed Jun. 5, 2020.)

There are two types of electrical termination, passive or resistive termination and active termination. Passive electrical termination is a circuit that includes a passive electrical component such as a resistor or a set of resistors connected in parallel. Active electrical termination is a circuit that includes an active electrical component such as a transistor or a set of transistors configured to perform electrical termination for an input signal.

The electrical termination circuit 316 may provide impedance matching in order to reduce signal reflections due to the signal's traversal of the pins 304, printed circuit board substrate 302, communication bus 306, bonding pad 308, wire bond 310, and ESD protection circuit 314. The electrical termination circuit 316 may convey high frequency interference, signals that would otherwise reflect, and reflected signal components to travel to ground, improving signal quality on the control line 312.

The control line 312 signal may next connect to the communication module 318, which may buffer, manipulate, or otherwise process the signal for use by the die controller 202, as described with regard to FIG. 2. The die controller 202 may send commands, data, and/or instructions using the control line 312 signal to direct operations, including storage operations, such as writes and reads, to the non-volatile memory array 210.

FIG. 4 illustrates the communication bus 306 introduced in FIG. 3. The communication bus 306 may provide signaling between the storage controller 104 and the memory die 112 using, in one embodiment, eight parallel signal control lines 402 as shown. "Communication bus" refers to hardware, software, firmware, logic, control line(s), and one or more associated communication protocols, that are configured to enable a sender to send data to a receiver. A communication bus may include a data bus and/or a control bus. A communication bus may be implemented as a parallel communication bus or a serial communication bus. A communication bus may be implemented using a set of control lines, for example, in a parallel communication bus, The eight control lines 402 may carry signals from the storage controller 104 to the memory die 112 and may be referred to as transmission lines 404 etched or otherwise formed within a printed circuit board substrate 302. Control lines 402 may be referred to as transmission lines when the electronic signal frequency's wavelength is within ten times or smaller than the physical length of the transmission path, where the signal's wavelength is related to the speed of light (v) divided by the signal frequency (f). Each transmission line 404 may have a characteristic impedance that may vary based on the geometry of the trace used to form the transmission line 404, as well as the materials used in constructing the trace, the transmission line, and/or the printed circuit board substrate 302.

"Control line" refers to a structure, circuit, circuitry, and/or associated logic configured to convey an electrical current and/or voltage from a source to a destination. In certain embodiments, analog voltages, currents, biases, and/or digital signals supplied or discharged over a control line are used to control switches, select gates, and/or other electrical components.

Certain control lines may have a specific name based on what parts of a circuit the control line controls or where the control line couples, or connects, to other circuits. Examples of named control lines include word lines, bit lines, source control lines, drain control lines, and the like.

"Transmission line" or "Electrical transmission line" refers to a specialized cable or other structure designed to conduct alternating current, or oscillating signal or voltage at a radio frequency (about 20 kHz-300 GHz), or higher. The frequency of the signal is high enough that a wave nature of the signal is taken into account. Transmission lines are used for purposes such as connecting radio transmitters and receivers with their antennas (they are then called feed lines or feeders), distributing cable television signals, trunk lines routing calls between telephone switching centers, computer network connections and high speed computer data buses. (Search "transmission line" and "radio frequency" on Wikipedia.com May 28, 2020. Modified. Accessed Jun. 4, 2020.)

A printed circuit board substrate 302 may be formed by laminated layers of alternating insulating dielectric substrate, metal, and insulative bonding material. The insulative dielectric materials and their thicknesses contribute to parasitic capacitive and inductive effects between each signal trace and nearby traces and ground or power planes. These parasitic effects may also vary based on the frequency components of the signal.

"Printed circuit board" or "PCB" refers to a structure that mechanically supports and electrically connects electrical or electronic components using conductive tracks, traces, pads, and other features etched from one or more sheet layers of copper laminated onto and/or between sheet layers of a non-conductive substrate. Components may be soldered onto the PCB to both electrically connect and mechanically fasten them to it.

PCBs can be single-sided (one copper layer), double-sided (two copper layers on both sides of one substrate layer), or multi-layer (outer and inner layers of copper, alternating with layers of substrate). Multi-layer PCBs allow for higher component density, because circuit traces on the inner layers free up surface space between components. Multilayer PCBs may include two, three, four, or more copper planes (layers for traces). (Search "printed circuit board" on Wikipedia.com May 22, 2020. Modified. Accessed Jun. 4, 2020.)

"Layer" refers to a planar set of material in a multilayer structure, such as a multilayer printed circuit board.

"Multilayer printed circuit board" refers to a printed circuit board or "PCB" comprising a plurality of layers of conductive and non-conductive materials. The layers of the multilayer printed circuit board may be configured to provide one or more of mechanical structural support and/or electrically conductive structures such as signal traces. Non-conductive layers of the multilayer printed circuit board may comprise insulation layers. Conductive layers of the multilayer printed circuit board may comprise a patterned metal such as copper, aluminum, or the like. Patterned structures of a conductive layer may be coated and/or encased a non-conductive layer formed on top of the conductive layer.

In certain embodiments, a lower most layer of the multilayer printed circuit board may comprise a substrate. The number and type of layers of a multilayer printed circuit board may vary depending on the use case. In certain embodiments, the multilayer printed circuit board comprises 4, 6, 8, 10, 12, or 18 layers. In one embodiment, a multilayer printed circuit board comprises a lower ground plane layer positioned adjacent to the substrate and an upper ground plane layer positioned above one more intermediate layers that are adjacent to the lower ground plane layer.

The resistive, capacitive, and inductive effects experienced on the transmission lines 404 may thus be designed to achieve an impedance that may be matched by the on-die electrical termination circuit 316 introduced in FIG. 3. Reducing and matching the impedance of the transmission lines 404 may improve signal quality by reducing reflections along the transmission lines 404. This may allow for greater signal bandwidth and speed between the storage controller 104 and the memory die 112.

Various structures having different configurations for the transmission lines 404 within the printed circuit board substrate 302, used to achieve a desired impedance, are referred to herein as signal compensation structures. In one embodiment, the communication bus comprises a parallel bus having a set of transmission lines 404, each transmission line 404 includes a signal compensation structure.

Figure 5:
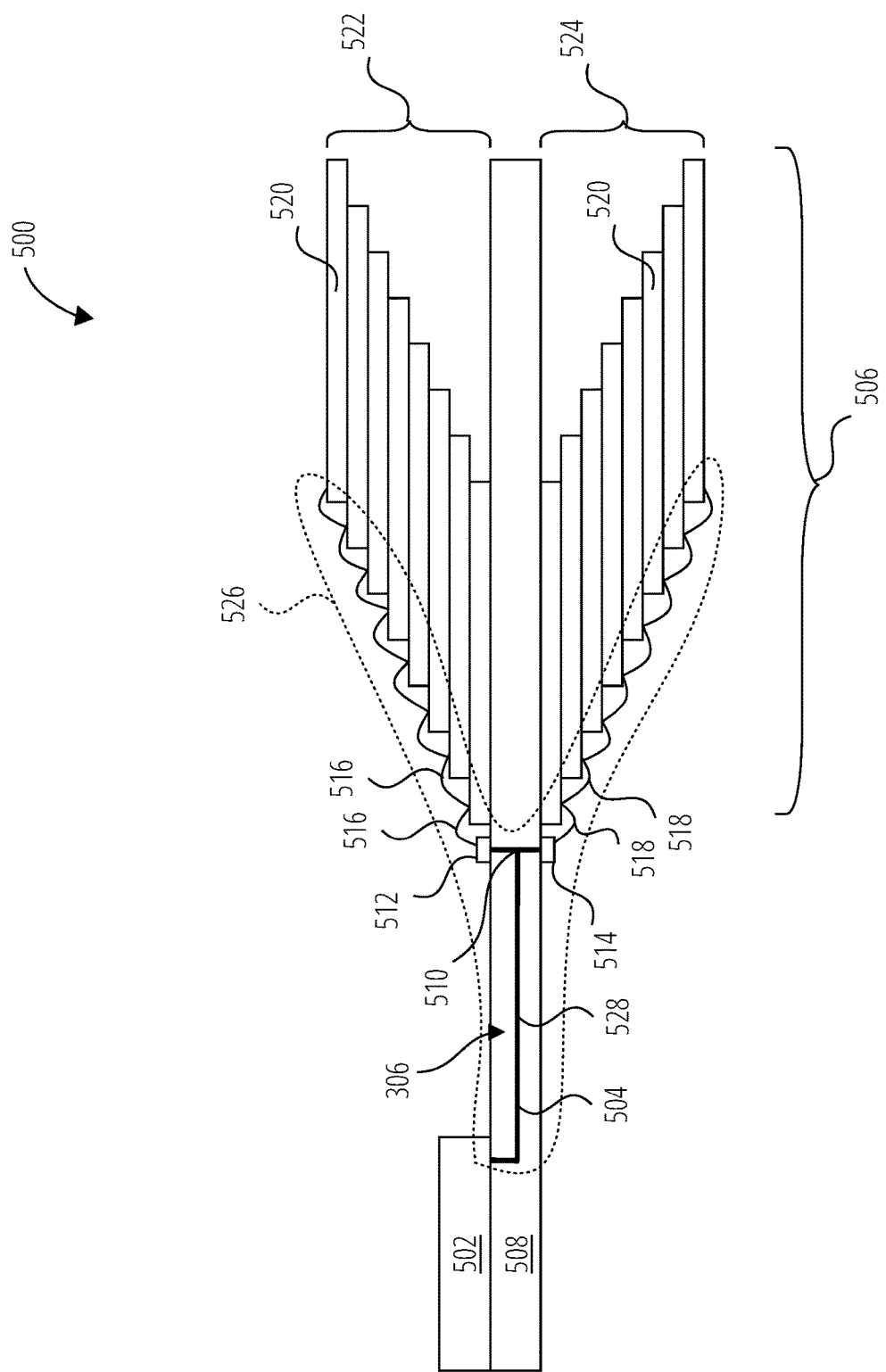
FIG. 5 illustrates a lateral cross-section view of a storage device 500 mounted to a multilayer printed circuit board in accordance with one embodiment.

FIG. 5 illustrates a storage device 500 in accordance with one embodiment. A storage controller 502 communicates via a communication bus 306 with a memory die stack 506. "Die stack" refers to a set of memory dies arranged such that each member of the set is positioned directly above or directly below either another memory die or a substrate.

The lateral cross-section view illustrates part of a single transmission line 504 of the communication bus 306. The transmission line 504 travels through a multilayer printed circuit board 508 from the storage controller 502 to a T-branch 510. "T-branch" refers to a structure within a multilayer printed circuit board, the T-branch connects to one or more signal traces to form a T shaped structure and is configured to route a signal up to a die stack mounted on top of the multilayer printed circuit board and to route a signal down to a die stack mounted on bottom of the multilayer printed circuit board.

At the T-branch 510, the transmission line 504 splits to connect with an upper bonding pad 512 and a lower bonding pad 514. The storage controller 502 coupled to the multilayer printed circuit board 508 in this manner may be configured to read from and write to one or more memory dies of the die stack 506.

From the upper bonding pad 512, a wire bond 516 may convey a signal on the transmission line 504 from one memory die 520 to another of the upper die stack 522, as illustrated. From the lower bonding pad 514, a wire bond 518 may connect the transmission line 504 signal from one memory die 520 to another memory die 520 of the lower die stack 524. The path traversed by the transmission line 504 signal, from storage controller 502 to the last memory die 520 of the upper die stack 522 and lower die stack 524, is referred to herein as the transmission path 526, indicated in this FIG. 5 by a dotted line.

"Transmission path" refers to an electrical signal that an electronic signal travels through a circuit or a portion of a circuit. A transmission path may include a variety of electrical components and may include one or more connections to a ground source, a signal source, and/or a power source. In certain embodiments, a transmission path may include a transmitter, a receiver, and one or more transmission lines. A transmission path may also be referred to as a 'main line.'

In the illustrated embodiment, the transmission line 504 includes one or more signal compensation structures, such as signal compensation structure 528. In one embodiment, the signal compensation structure 528 is integrated with the multilayer printed circuit board 508. The signal compensation structure 528 may include a first signal trace connected to a first signal source and two ground traces connected to a ground source.

In another embodiment, the signal compensation structure 528 may include the first signal trace and a second signal trace which may each connect to the T-branch 510 connected to the upper bonding pad 512 and the lower bonding pad 514. The upper die stack 522 and lower die stack 524 may, in one embodiment, each include more than four memory dies 520. The first signal trace and the second signal trace may couple to a first signal source provided by the storage controller 502.

"Signal source" refers to a circuit, sub-circuit, electronic component, hardware, software, firmware, module, logic, device, or apparatus configured, programmed, designed, arranged, or engineered to supply a voltage, current, or electromagnetic wave that varies over time, either in analog or digital wave form, to another structure, circuit, sub-circuit, electronic component, logic, device, or apparatus.

"Ground plane" refers to an electrically conductive surface or plane, usually connected to electrical ground. In printed circuit boards, a ground plane is a large area of copper foil of a printed circuit board which is connected to the power supply ground terminal and serves as a return path for current from different components on the printed circuit board.

In multilayer PCBs, a ground plane may be a separate layer covering the entire board. This serves to make circuit layout easier, allowing the designer to ground any component without having to run additional traces; component leads needing grounding are routed directly through a hole in the printed circuit board to the ground plane on another layer. The large area of copper also conducts the large return currents from many components without significant voltage drops, ensuring that the ground connection of all the components are at the same reference potential. (Search "ground plane" on Wikipedia.com Mar. 31, 2020. Modified. Accessed Jun. 4, 2020.)

Figure 6:
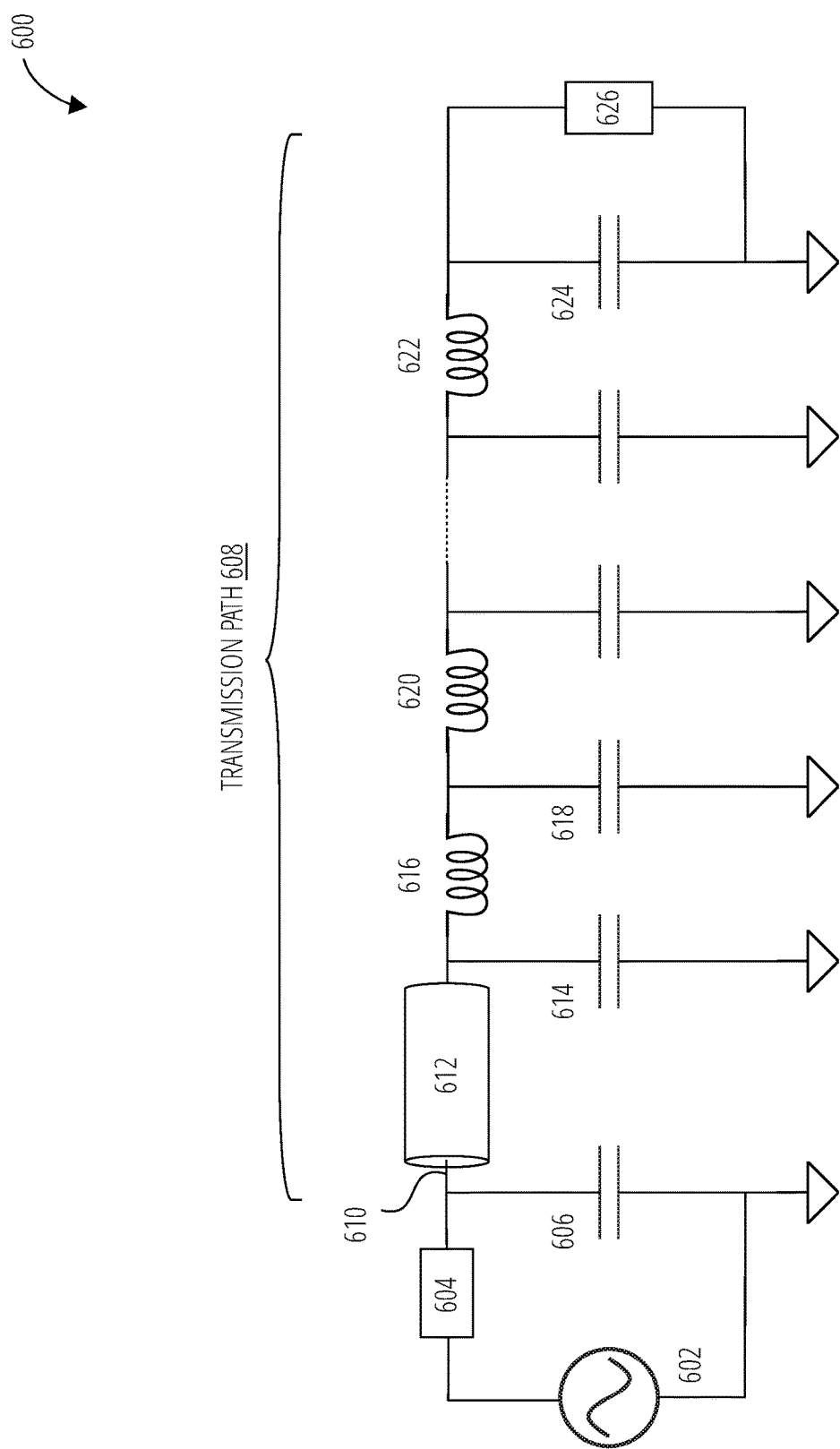
FIG. 6 illustrates a die stack interconnect model 600 in accordance with one embodiment.

FIG. 6 illustrates a die stack interconnect model 600. The storage controller introduced in previous drawings may be modeled as a variable voltage source 602, an impedance 604, and a parasitic capacitance 606. The transmission path 608 introduced in FIG. 3 may be modeled as a transmission line 610 having a characteristic impedance 612, and a series of parasitic capacitances and inductances incurred by the die stack interconnections.

Parasitic capacitance and inductance refer to an unavoidable and usually unwanted capacitance and/or inductance that exists in transmission line components (ex, vias and connectors) and/or with termination circuits (ESD and transceiver circuits). These unavoidable parasitics need to be accounted for by the termination and/or PCB compensation components/circuits.

In the die stack interconnect model 600 illustrated, parasitic capacitance 614 and inductance 616 represent the interconnection with a first memory die in a die stack. Parasitic capacitance 618 and inductance 620 represent the connection of a next memory die in the stack, and so on. Inductance 622 and parasitic capacitance 624 represent the connection to an end memory die (i.e., A last memory die connected on the transmission path).

In order to more closely match the impedance of the transmission path 608 and reduce signal reflections along the path, end die electrical termination 626 may be provided on the memory die(s) of the die stack farthest from the storage controller. The transmission path 608 impedance may be considered the aggregate of the elements along the transmission path 608, including the transmission line 610 characteristic impedance 612, the parasitic capacitances, and the inductances shown. The end die electrical termination 626, therefore, may be configured to terminate transmission line effects due to each of these components. The end die electrical termination 626 may be implemented using a passive resistance circuit and/or an active resistance circuit.

Figure 7:
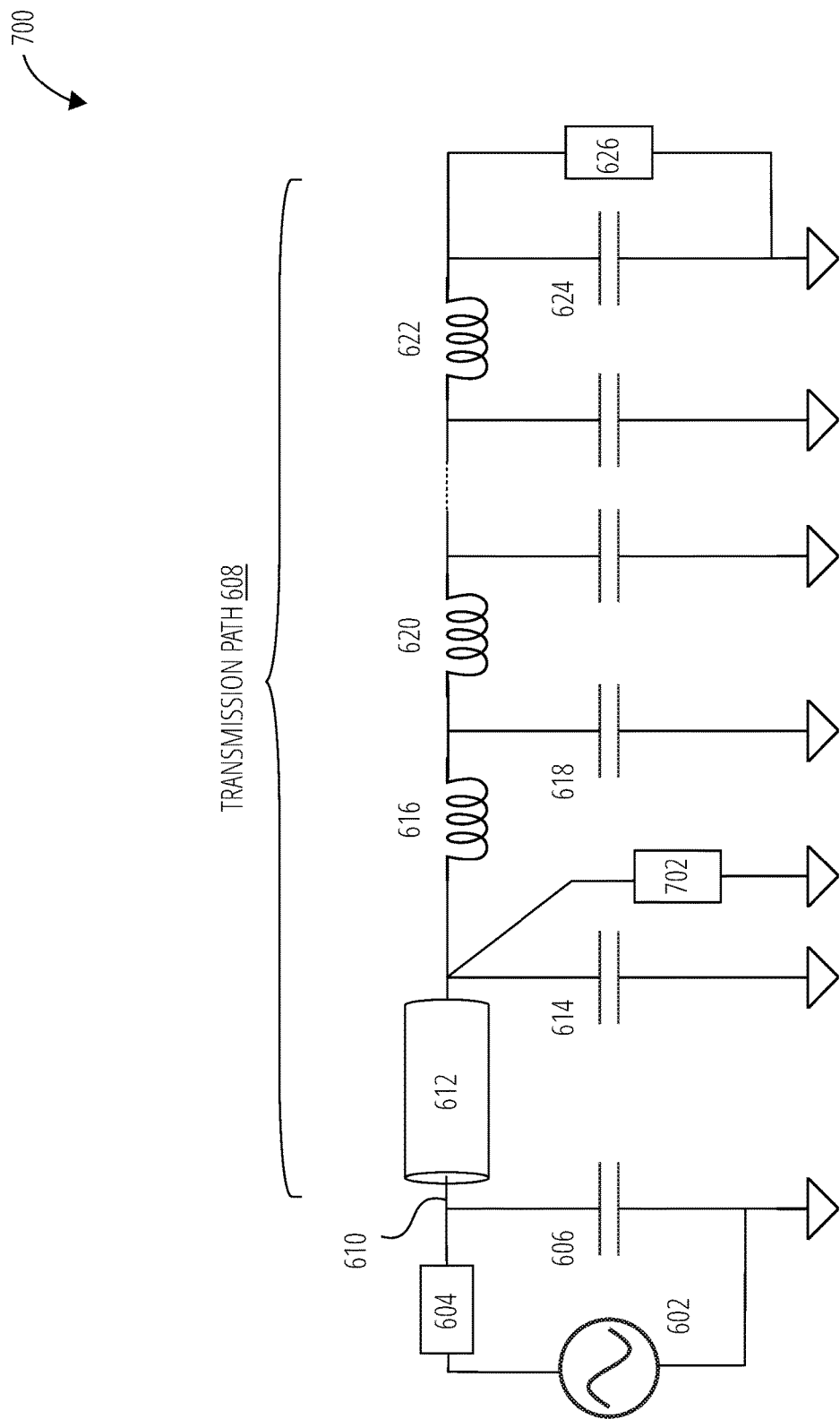
FIG. 7 illustrates a die stack interconnect model 700 in accordance with one embodiment.

FIG. 7 illustrates a die stack interconnect model 700 with active die electrical termination 702. In addition to the end die electrical termination 626 introduced in FIG. 6, which counteracts the transmission line effects along the entire transmission path 608, active die electrical termination 702 may be provided to counteract the additional effects incurred at a specific memory die when that memory die is in active use, e.g., is being read from, is transmitting a signal on the transmission line to the storage controller.

Active die electrical termination 702 is often configurable such that it may be switched on or off. Thus, active die electrical termination 702 circuitry may be switched on to sink reflections and other interference at the active memory die when that memory die is in use, but may be switched off when that memory die is not in use, in order to conserve power, and so as not to incur additional reflections along the transmission path 608. The active die electrical termination 702 shown is associated with the node representing the first memory die in the die stack, also characterized by parasitic capacitance 614 and inductance 616, in order to model active die electrical termination 702 when the first memory die is active. A similar structure may be modeled having a similar relationship to parasitic capacitance 618 and inductance 620 in order to model active die electrical termination 702 while the second memory die is active, and so on.

Figure 8:
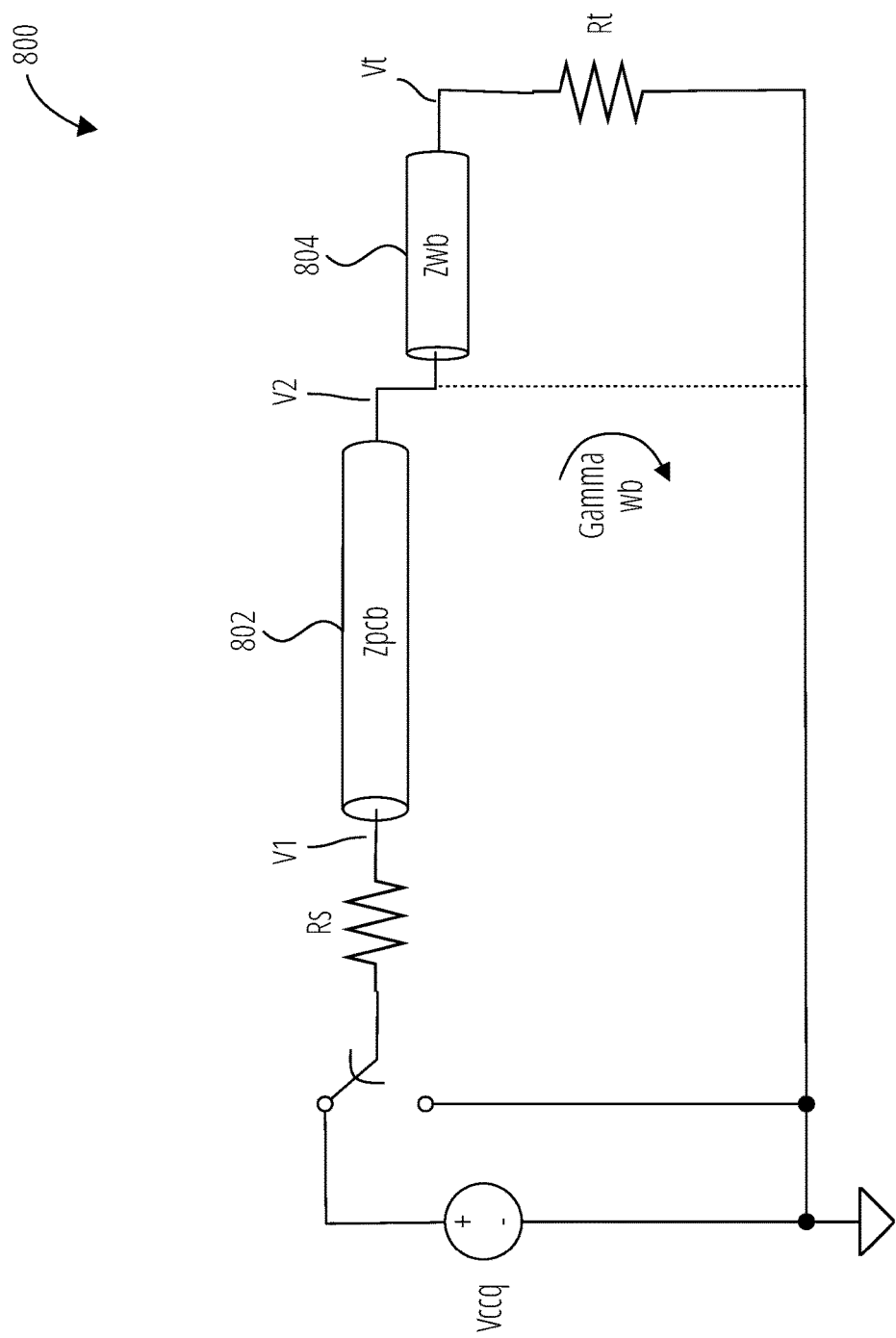
FIG. 8 illustrates a die stack interconnect model 800 in accordance with one embodiment.

FIG. 8 illustrates a die stack interconnect model 800 in accordance with one embodiment. A switched connection between a power source of Vccq and ground may be used to model a signal source provided to the die stack interconnect model 800. A source resistance Rs may be used to model resistance encountered at the signal source. Rt may be used to model the termination resistance implemented to reduce reflections along the transmission path.

In addition, a printed circuit board transmission line 802 (which may be implemented at least in part using a signal compensation structure) is illustrated, having a characteristic impedance of Zpcb, as well as a wire bond 804 having a characteristic impedance of Zwb. Typically, Zpcb is greater than Zwb. The difference in impedance between the source (Rs), the printed circuit board transmission line 802 (Zpcb), the wire bond 804 (Zwb), and the termination impedance (Rt) may each give rise to reflected signals that may cause a weakening of the intended signal, which may be expressed as added latency in the time taken for the signal to travel from one end of the transmission path and back. Reducing these reflections by matching impedances has the same effect as bringing a transmitter (e.g., a controller) closer to a receiver (e.g., a die stack), thus reducing latency and improving signal speed and bandwidth.

A reflection coefficient Gamma may be used to express how much a signal may be impacted by reflections at a point of impedance mismatch. The reflection coefficient is a ratio of the voltage or current of the reflected wave to the voltage or current of the incident wave, or the wave that passes past the point of reflection to continue down the transmission line. Gamma may also be expressed as a function of characteristic impedances, as shown in the equation below.

For cases where Zpcb is configured to match Rs, for example, V1 would equal V2, and there would be no reflections, and no reduction of signal strength. Where Rt is configured to match Zwb, again, no reflections would occur. However, a mismatch between Zpcb and Zwb may cause reflections, which may be represented as indicated in Equation 1.

$$Gamma_{wb} = \frac{Z_{wb} - Z_{pcb}}{Z_{wb} + Z_{pcb}}$$ Equation 1

Implementing a signal compensation structure within the printed circuit board transmission line 802 may reduce Zpcb to match Zwb, or to substantially match Zwb. In this case, the reflection coefficient $Gamma_{wb}$ may be reduced to zero, yielding a signal with no or fewer reflections. Such a signal compensation structure, implemented on the multilayer printed circuit board characterized by printed circuit board transmission line 802 as having Zpcb, may comprise a first signal trace coupled to a first signal source and two ground traces coupled to a ground source. "Ground source" refers to a structure or connection or component that serves as ground or serves to ground an electrical signal.

A storage controller, characterized here by the switched signal between power and ground, may be coupled to the multilayer printed circuit board and configured to read from, and write data to, a set of memory dies. These memory dies may include the termination characteristics modeled here as Rt. A die stack may be coupled to the multilayer printed circuit board, comprising a set of memory dies connected to each other by one or more wire bonds 804, represented here as having impedance Zwb. The signals of the communication bus configured to connect the memory dies to the storage controller through a signal compensation structure may incur minimal or no reflections as described with regard to this figure.

Figure 9:
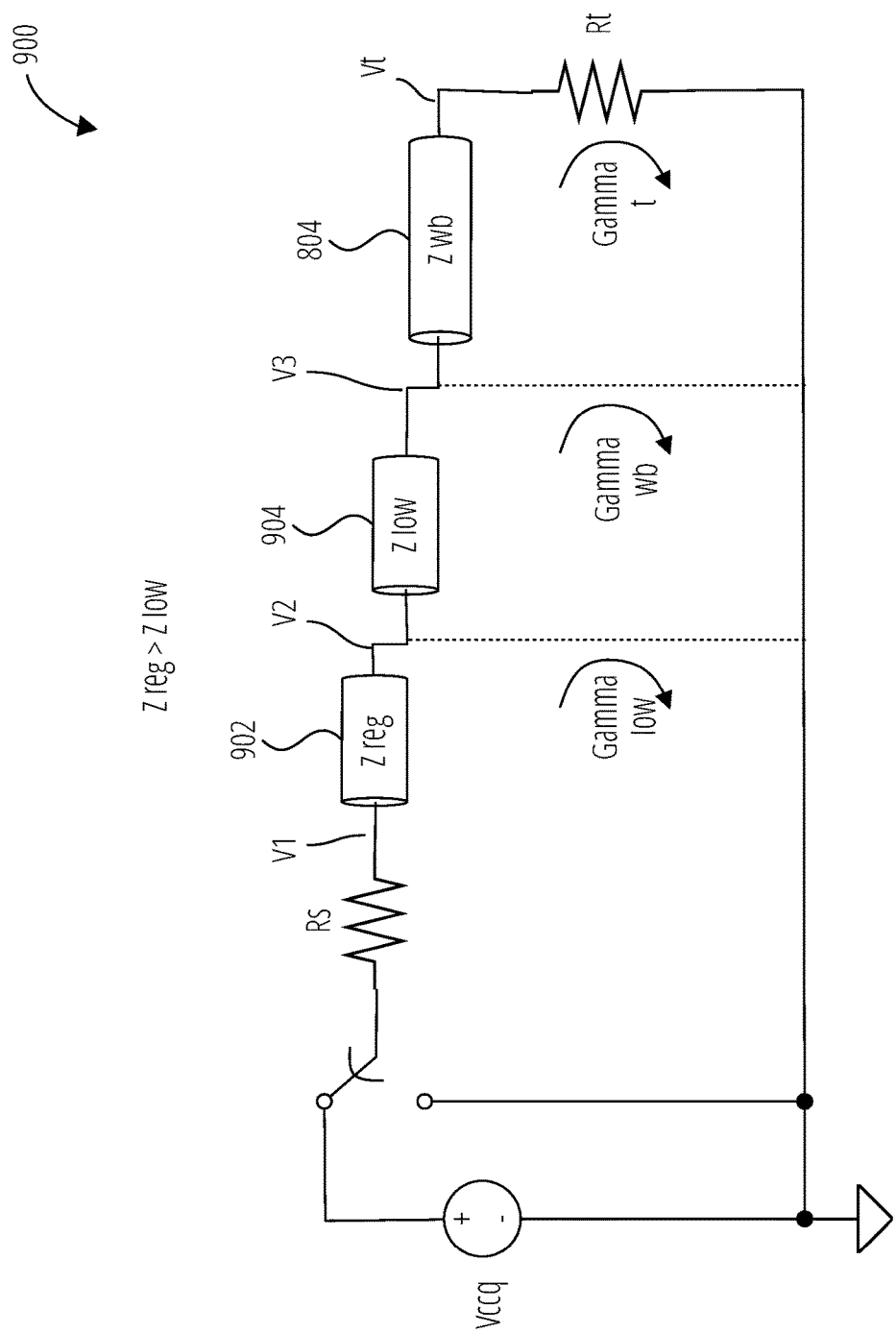
FIG. 9 illustrates a die stack interconnect model 900 in accordance with one embodiment.

FIG. 9 illustrates a die stack interconnect model 900 in accordance with one embodiment. The switched signal that varies between Vccq and ground, source resistance Rs, wire bond 804 having a characteristic impedance Zwb, and the termination resistor Rt, may be similar to those components introduced in FIG. 8.

FIG. 8 illustrates a model for a transmission line that includes two sections. A first section between a storage controller and a signal compensation structure, may include a signal trace 902 and a ground trace. The signal trace 902 and ground trace may comprise a conventional or regular signal trace and ground trace. The signal trace 902 may connect to a bonding pad for a pin of the storage controller. The signal trace 902 may also connect to a source via connected to a signal driver, a signal source, from the storage controller. The ground trace corresponding to the signal trace 902 may connect to a ground source or a ground via.

"Via" refers to a conductive structure configured to electrically connect a conductor on one level of a multilayer metal stack to another conductor on another level of the multilayer metal stack. Vias may be made of a variety of conductive materials. Often vias are made from tungsten and may be referred to as 'plugs' or 'contact plugs.'

"Source via" refers to a via configured to electrically connect a signal source or a structure conducting a signal source to a signal trace. "Ground via" refers to a via configured to electrically connect a ground source (also referred to simply as 'ground') or a structure conducting an electrical signal to a ground source.

The signal trace 902 (and its corresponding ground trace) may be represented by signal trace 902 having characteristic impedance Z reg, comparable to a conventional PCB signal trace.

A second section of the transmission line may comprise the signal compensation structure which connects the signal trace 902 to a bonding pad, T-branch, memory die pin, or the like. The signal compensation structure may be part of the transmission path represented by signal compensation structure 904, having low characteristic impedance Z low. The characteristic impedance Z low may be lower than that of a conventional PCB signal trace (such as signal trace 902), Z reg.

The signal compensation structure 904 may connect to the signal trace 902 and its corresponding ground trace using a variety of structures and/or configurations. How the signal compensation structure 904 connects to the signal trace 902 and its corresponding ground trace depends in part on the configuration of the signal compensation structure 904. For example, the corresponding ground trace may connect to one of an upper ground plane, a lower ground plane, and one of multiple ground vias. The signal trace 902 may be positioned within a first layer of a multilayer printed circuit board. The signal trace 902 may have a characteristic impedance of about 50 Ohms in response to a signal source oscillating at a frequency's wavelength is within about ten times the physical length of the transmission path. For example, in one embodiment, the transmission path may be 90 millimeters or about 90 millimeters and the frequency of the signal on the transmission path may be at, or greater than, 333 MHz.

Reflection coefficients (Gamma) are shown for the points of impedance mismatch, if Rs is configured to substantially match Z reg. Impedance matching between the characteristic impedances illustrated may bring the reflection coefficients at that junction to zero, as described by the equations below. Equation 2 illustrates the reflection coefficient (Gamma$_{low}$) at the transition to the signal compensation structure 904.

$$Gamma_{low} = \frac{Z_{low} - Z_{reg}}{Z_{low} + Z_{reg}} \quad \text{Equation 2}$$

Equation 3 illustrates the reflection coefficient (Gamma$_{wb}$) at the transition to the wire bond 804.

$$Gamma_{wb} = \frac{Z_{wb} - Z_{low}}{Z_{wb} + Z_{low}} \quad \text{Equation 3}$$

Equation 4 illustrates the reflection coefficient (Gamma$_t$) at the end of the transmission line.

$$Gamma_t = \frac{R_T - Z_{wb}}{R_T + Z_{wb}} \quad \text{Equation 4}$$

As it may not be possible to match impedance across the entirety of a transmission path, adjustments to the configurations contributing to these reflection coefficients may allow the freedom needed to reduce reflections and effectively bring the storage controller electrically closer to the memory dies.

Figure 10A:
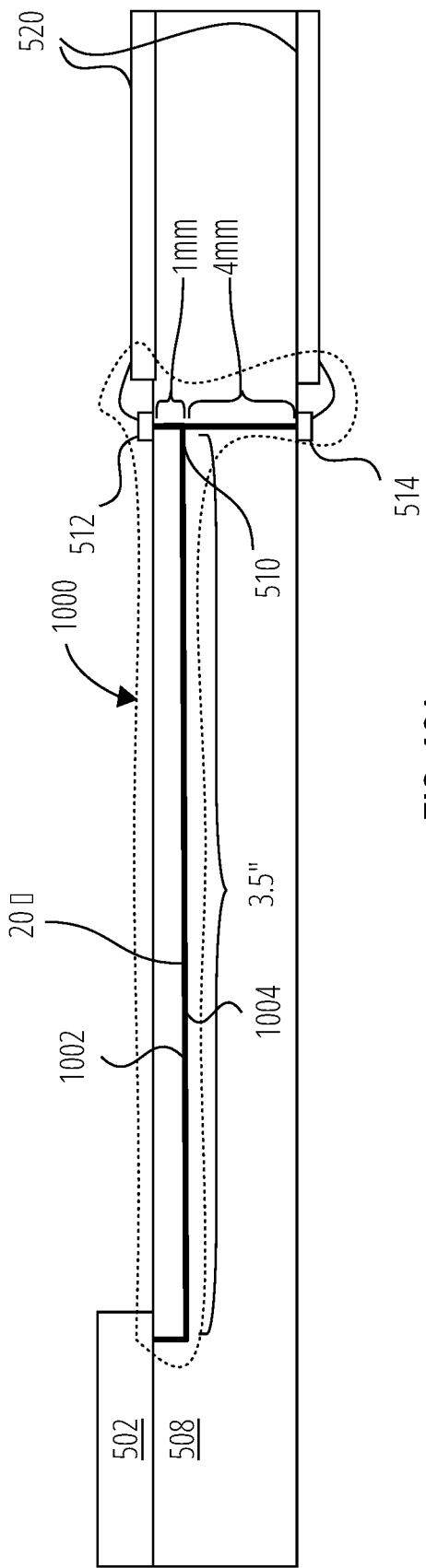
FIG. 10A illustrates a lateral cross-section view of a transmission path 1000a in accordance with one embodiment.

FIG. 10A illustrates a transmission path 1000a to an upper die stack (only a single upper memory die is shown for simplicity) and lower die stack (only a single lower memory die is shown for simplicity). The storage controller 502 may couple to a multilayer printed circuit board 508. The multilayer printed circuit board 508 may incorporate a transmission line 1002 configured to be about 3.5 inches long, and to have a characteristic impedance of 20 ohms. The transmission line 1002 is one of many that form a communication bus. The transmission line 1002 may be formed principally from a signal compensation structure 1004 that may traverse the multilayer printed circuit board 508 to a T-branch 510, where the signal compensation structure 1004 splits to travel a distance of about 1 mm to the upper bonding pad 512 and about 4 mm to the lower bonding pad 514. The bonding pads may attach to the memory dies 520 through a wire bond, as introduced in FIG. 3. In the illustrated embodiment, signal compensation structure 1004 may span the whole or a majority of a distance between a storage controller and a die stack.

Figure 10B:
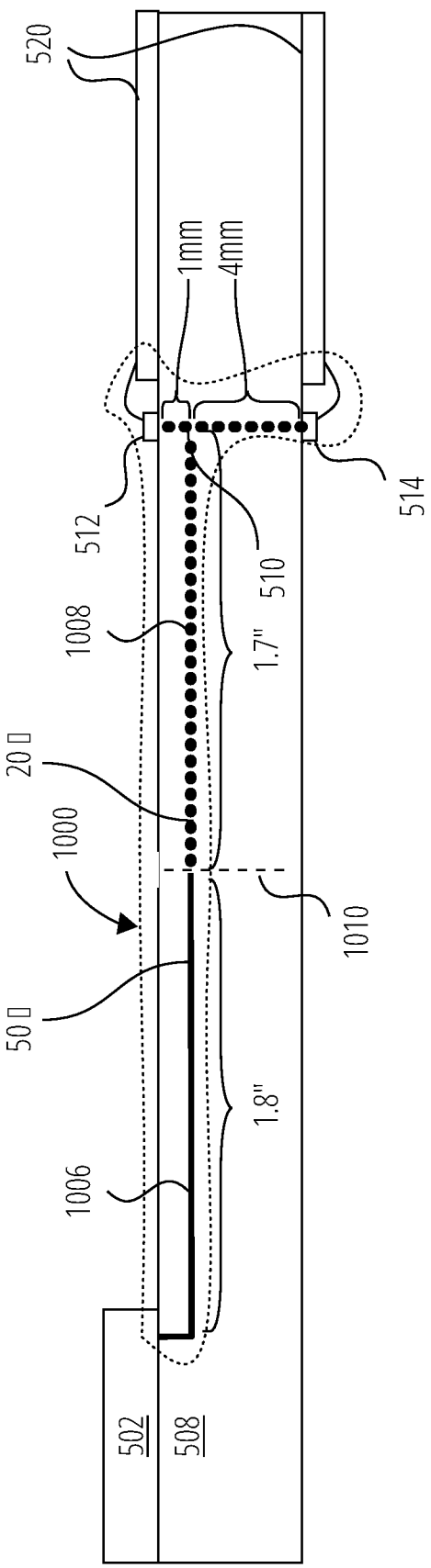
FIG. 10B illustrates a lateral cross-section view of a transmission path 1000b that includes a transmission line and a signal compensation structure in accordance with one embodiment.

FIG. 10B illustrates a transmission path 1000b in accordance with one embodiment that includes a conventional signal trace configuration for part of the transmission path 1000b and a signal compensation structure 1008 for a remainder of the transmission path 1000b. A conventional signal trace may include signal trace 1006 connected between a bonding pad for a pin of the storage controller 502 and the signal compensation structure 1008.

The transmission path 1000b may include a transition 1010, or coupling, that connects the signal trace 1006 and the signal compensation structure 1008. In one embodiment, the transition 1010 includes one or more vias that connect one or more traces and associated one or more ground traces of the signal trace 1006 with suitable traces or structures of the signal compensation structure 1008. The vias connect traces or ground traces between different layers of the multilayer printed circuit board 508.

For example, in one embodiment, a signal trace of the signal trace 1006 may connect at the transition 1010 to a signal trace of the signal compensation structure 1008 via a source via. Ground traces of the signal compensation structure 1008 may connect to a ground plane directly or by way of a ground via. The signal trace 1006 may be positioned within a first layer of the multilayer printed circuit board 508. The signal trace 1006 may comprise a characteristic impedance of about 50 ohms in response to the signal components composed of signal frequencies' wavelength being within about ten times the physical length of the transmission path.

The signal trace 1006 may traverse the multilayer printed circuit board 508 for a distance of about 1.8 inches and have a typical characteristic impedance of 50 ohms. The signal compensation structure 1008 may traverse the multilayer printed circuit board 508 for a distance of about 1.7 inches, such that the signal trace 1006 and signal compensation structure 1008 together traverse about 3.5 inches. The signal compensation structure 1008 may have a characteristic impedance of as low as 20 ohms.

The embodiment of FIG. 10B, with reference to FIG. 9, may step down the characteristic impedance to mitigate signal reflection.

Figure 11A:
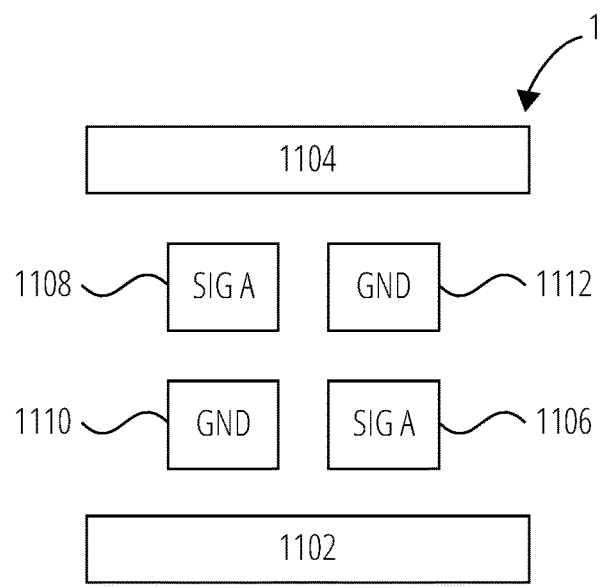
FIG. 11A illustrates a cross-section view of a signal compensation structure 1100a in accordance with one embodiment.

FIG. 11A illustrates a cross-sectional view of signal compensation structure 1100a in accordance with one embodiment. The signal compensation structure 1100a is formed within the layers of a multilayer printed circuit board 508 (more details shown in FIG. 11B). The signal compensation structure 1100a may include a lower ground plane 1102, an upper ground plane 1104, a pair of signal traces, and a pair of ground traces. "Upper ground plane" refers to a ground plane positioned in a multilayer printed circuit board above another ground plane. In certain embodiments, the upper ground plane may be atop most ground plane. "Lower ground plane" refers to a ground plane positioned in a multilayer printed circuit board below another ground plane. In certain embodiments, the lower ground plane may be the lowest ground plane and/or a final layer that is adjacent to a substrate for the lower ground plane. The ground planes provide a ground source and electromagnetic shielding to the signal traces.

The pair of signal traces (first signal trace 1106 and second signal trace 1108 each carrying the same signal SIG A) are positioned between the lower ground plane 1102 and upper ground plane 1104 and diagonally with respect to each other. The pair of ground traces (first ground trace 1110 and second ground trace 1112) are positioned between the lower ground plane 1102 and upper ground plane 1104 and diagonally with respect to each other and each adjacent to one of the first signal trace 1106 and second signal trace 1108. In this configuration, the first signal trace 1106, second signal trace 1108, first ground trace 1110, and second ground trace 1112 interact with each other and the lower ground plane 1102 and upper ground plane 1104 electromagnetically to reduce the impedance along the signal compensation structure.

Figure 11B:
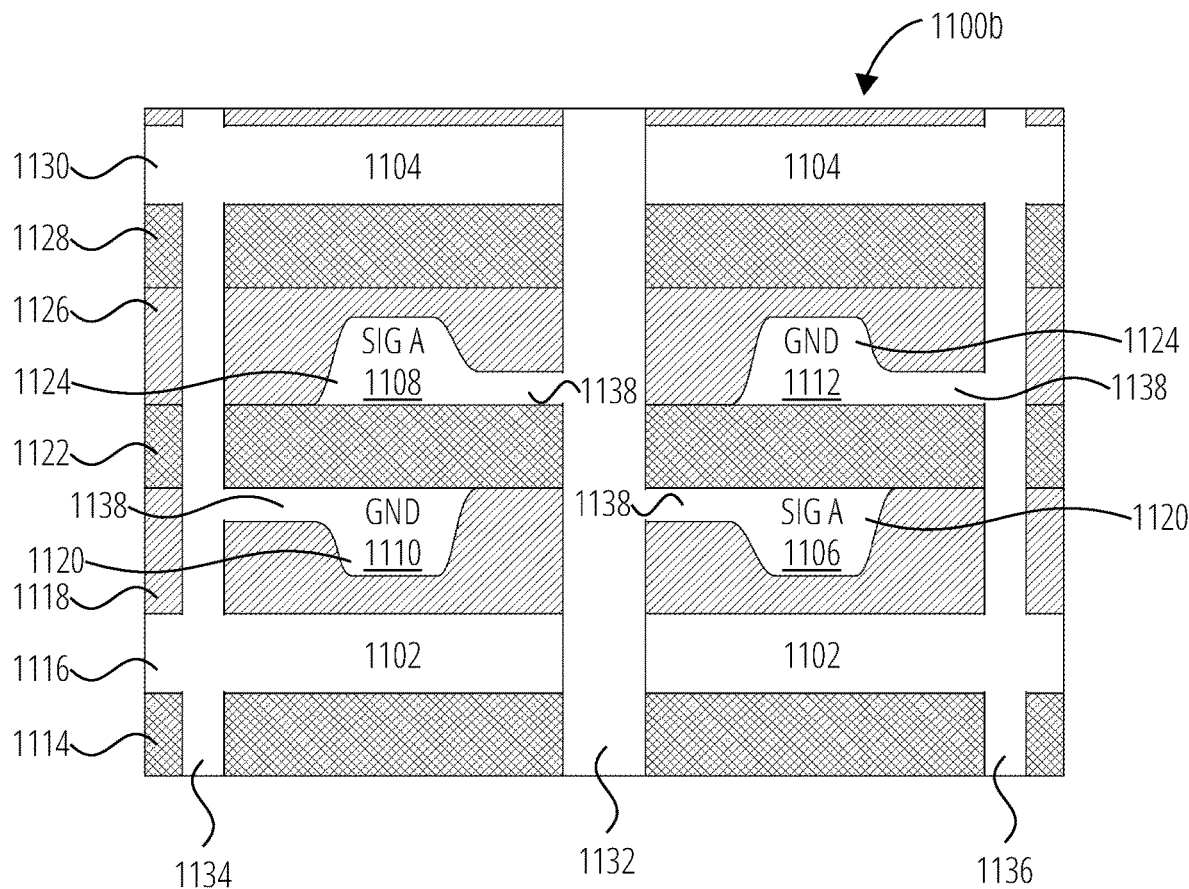
FIG. 11B illustrates a cross-section view of a signal compensation structure 1100b in accordance with one embodiment.

FIG. 11B illustrates a cross-sectional view of a signal compensation structure 1100b in one embodiment that includes details of layers of a multilayer printed circuit board 508. The signal compensation structure 1100b is configured in a similar manner to the signal compensation structure 1100a illustrated in FIG. 11A. The physical features illustrated for this embodiment are not intended to limit the construction of a similar configuration using different materials or arrangement of layers within a multilayer printed circuit board.

The lower ground plane 1102, first ground trace 1110, first signal trace 1106, second signal trace 1108, second ground trace 1112, and upper ground plane 1104 introduced in FIG. 11A may be implemented within layers of a multilayer printed circuit board as shown. The multilayer printed circuit board may include a substrate that includes substrate layer 0 1114 and a plurality of alternating insulation layers and metal layers.

"Substrate" refers to a material which provides a surface on which something is deposited or inscribed, for example a silicon wafer used to manufacture integrated circuits and or semiconductors. (Search "substrate" on lexico.com © 2020 Lexico.com. Edited. Accessed Apr. 3, 2020.) A substrate may be a rigid or flexible structure and may be planar in shape. A substrate may also be used in a printed circuit board (PCB). Typically, a substrate is non-conductive or semi-conductive and may be formed from a variety of materials including silicon, plastic, resin, fiberglass, silicon dioxide, aluminum oxide, sapphire, germanium, gallium arsenide (GaAs), an alloy of silicon and germanium, indium phosphide (InP), or the like.

In certain embodiments, a substrate may comprise a silicon wafer and in other embodiments, a substrate may comprise another layer of an integrated semiconductor, including, but not limited to, a top surface of a cell film stack, or the like.

"Insulation layer" refers to a planar layer of material configured to provide electrical insulation between electrical components on either side of the insulation layer. In one embodiment, the insulation layer is made of a dielectric material, such as a plastic, epoxy, silicon, fiberglass, or the like. In certain embodiments, substrate layers serve to provide electrical insulation. Consequently, an insulation layer may be used interchangeably herein with a substrate or substrate layer.

In the illustrated embodiment, the multilayer printed circuit board includes metal layer 0 1116 that includes the lower ground plane 1102, an insulation layer 0 1118 preventing metal-to-metal contact with metal layer 1 1120. Substrate layer 1 1122 sits above metal layer 1 1120. Metal layer 2 1124 sits above substrate layer 1 1122. Insulation layer 1 1126 sits above metal layer 2 1124. Substrate layer 2 1128 sits above insulation layer 1 1126 and metal layer 3 1130 sits above substrate layer 2 1128. The metal layer 3 1130 may include the upper ground plane 1104. In certain embodiments, the lower ground plane 1102 and/or upper ground plane 1104 may be referred to as a ground plane layer. Metal layer 1 1120 may be referred to as a first layer and metal layer 2 1124 may be referred to as a second layer.

In other configurations, substrate layers and insulation layers maybe incorporated in a different order, depending on the types of printed circuit boards laminated together to form the multilayer printed circuit board. In one embodiment, a layer separating the metal layer 1 1120 and metal layer 2 1124 may be an insulation layer rather than substrate layer 1 1122.

In one embodiment, first signal trace 1106 carrying SIG A is formed within metal layer 1 1120 adjacent to first ground trace 1110 also formed within metal layer 1 1120. In one embodiment, the first signal trace 1106 and first ground trace 1110 are in the same layer of the multilayer printed circuit board. Second signal trace 1108 also carrying SIG A is formed within metal layer 2 1124 adjacent to second ground trace 1112 also formed within metal layer 2 1124. In one embodiment, the second signal trace 1108 and second ground trace 1112 are in the same layer of the multilayer printed circuit board. The first signal trace 1106, second signal trace 1108, first ground trace 1110, and/or second ground trace 1112 may be formed by conventional fabrication techniques including metal deposition, metal etching, or the like.

In certain embodiments, the first signal trace 1106 of metal layer 1 1120 is positioned directly below the second ground trace 1112 of metal layer 2 1124. In addition, the second signal trace 1108 is positioned directly above first ground trace 1110. Advantageously, such a configuration conserves space and may enhance an electromagnetic coupling between the first signal trace 1106, second ground trace 1112, first ground trace 1110, and/or second signal trace 1108.

In one embodiment, the signal compensation structure 1100b includes one or more vias that connect traces such as signal traces and/or ground traces. In FIG. 11B, the signal compensation structure 1100b may include at least one source via 1132 and/or at least one ground via (e.g., first ground via 1134, second ground via 1136). In the illustrated embodiment, the source via 1132 may provide an electrical connection between the first signal trace 1106 and the second signal trace 1108 and a source signal provided by a storage controller. In one embodiment, the via may be wide, as shown, in order to accept a through-hole pin from the storage controller, such as the pins 304 illustrated in FIG. 3. The source via 1132 may connect to the first signal trace 1106 and/or second signal trace 1108 by way of a connector 1138, such as an angled connector (described more below).

A first ground via 1134 and second ground via 1136 may be used to connect the first ground trace 1110 and second ground trace 1112 to the lower ground plane 1102 and/or upper ground plane 1104, and the lower ground plane 1102 and upper ground plane 1104 to each other, as illustrated. The lower ground plane 1102 and/or upper ground plane 1104 may connect to a ground source. In one embodiment, the first ground via 1134 may connect the first ground trace 1110 to the lower ground plane 1102, and the second ground via 1136 may connect the second ground trace 1112 to the upper ground plane 1104. The ground vias may connect to the ground traces using one or more connector connectors 1138.

FIG. 11C illustrates a signal compensation structure 1100c in accordance with one embodiment. A first ground trace 1110, first signal trace 1106, second signal trace 1108, and second ground trace 1112 are arranged on a first layer 1140 and second layer 1142 as shown in FIG. 11A, FIG. 11B, and FIG. 11C. First ground trace 1110 connects to a first ground via 1134, first signal trace 1106 and second signal trace 1108 connect to a source via 1132, and second ground trace 1112 may connects to a second ground via 1136. First signal trace 1106 and second signal trace 1108 may both carry the same signal, SIG A.

The embodiment of signal compensation structure 1100c may further include two traces (third signal trace 1144 and fourth signal trace 1146) carrying SIG B and a pair of ground traces (third ground trace 1148 and fourth ground trace 1152) each configured and positioned as illustrated. In certain embodiments, first signal trace 1106 and second signal trace 1108 carry SIG A for a first transmission line of a communication bus 306 and third signal trace 1144 and fourth signal trace 1146 carry SIG B for a second transmission line of the communication bus 306. The layout, pattern, and configuration of signal compensation structure 1100c may be repeated for each transmission line of the communication bus 306, in certain embodiments.

FIG. 11D illustrates a signal compensation structure 1100d in accordance with another embodiment. A first ground trace 1110 of two ground traces is positioned within a first layer 1140 of a multilayer printed circuit board and the first signal trace 1106 is positioned directly above the first ground trace 1110 in a second layer 1142. The second layer 1142 is adjacent to the first layer 1140. The second ground trace 1112 of the two ground traces is positioned directly above the first signal trace 1106 within a third layer 1156 of the multilayer printed circuit board. The third layer 1156 is adjacent to the second layer 1142. In this configuration, the first signal trace 1106 has a first ground trace 1110 below and a second ground trace 1112 above. The cross-section view of embodiments of signal compensation structures illustrated herein show how the signal compensation structure is configured for the length of the signal compensation structure.

FIG. 11E illustrates a signal compensation structure 1100e in accordance with another embodiment. The first signal trace 1106 of the signal compensation structure 1100e is positioned between the two ground traces, ground trace 1160 and ground trace 1162, within a first layer 1140 of the multilayer printed circuit board. In addition, a first ground trace 1110 is positioned directly above the first signal trace 1106 and within a second layer 1142. The second layer 1142 may be above and adjacent to the first layer 1140. A second ground trace 1112 may be positioned directly below the first signal trace 1106 and within another layer 1158 which is adjacent to and below the first layer 1140.

Figure 11G:
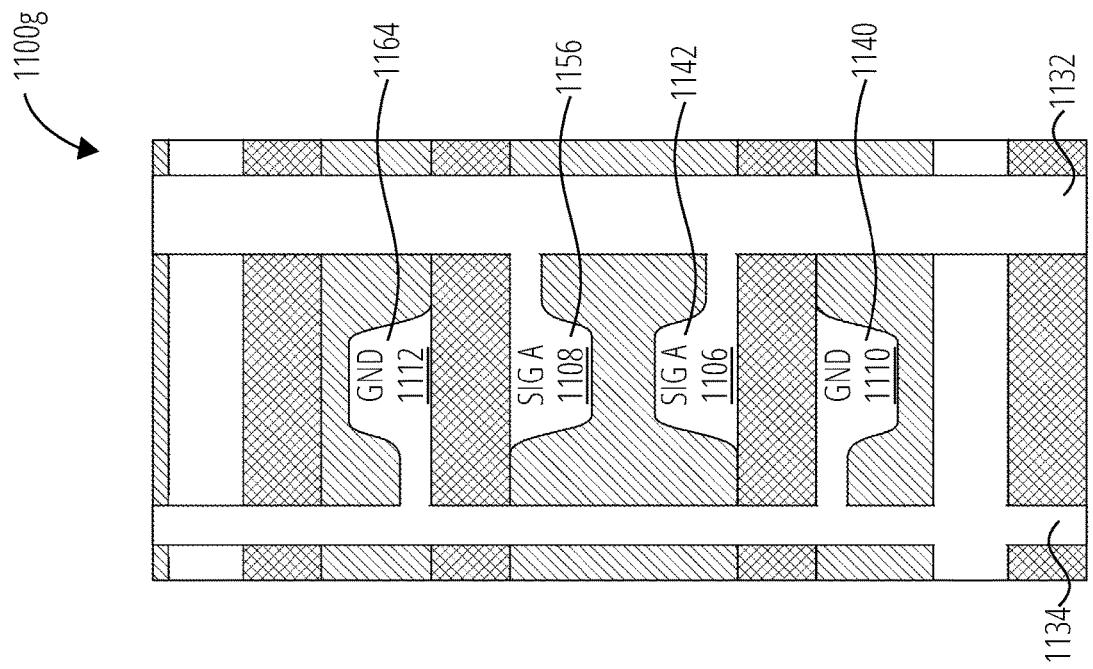
FIG. 11G illustrates a cross-section view of a signal compensation structure 1100g in accordance with one embodiment.
Figure 11F:
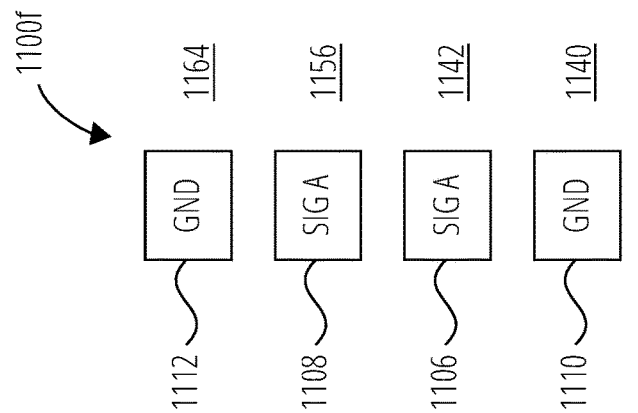
FIG. 11F illustrates a cross-section view of a signal compensation structure 1100f in accordance with one embodiment.

FIG. 11F illustrates a signal compensation structure 1100f in accordance with one embodiment. A first ground trace 1110, first signal trace 1106, second signal trace 1108, and second ground trace 1112 may be arranged each above the other in four layers (e.g. first layer 1140, second layer 1142, third layer 1156, fourth layer 1164), as illustrated in FIG. 11G.

FIG. 11G illustrates a signal compensation structure 1100g in accordance with one embodiment. Specifically, FIG. 11G illustrates the signal compensation structure 1100f embodiment in more details. The traces indicated in FIG. 11F may be arranged within a physical multilayer printed circuit board as shown.

Note that this configuration of printed circuit board materials is not meant to be limiting with regard to the arrangement of metal layers and various types of insulation layers, provided each metal layer is adequately insulated, and the physical dimensions yield the desired transmission line characteristics.

A first ground trace 1110 of two ground traces is positioned within a first layer 1140 of the multilayer printed circuit board. The first signal trace 1106 is positioned directly above the first ground trace 1110 in a second layer 1142 of the multilayer printed circuit board. The second layer 1142 is adjacent to the first layer 1140.

A second signal trace 1108 is positioned directly above the first signal trace 1106 and within a third layer 1156 above and adjacent to the second layer 1142. The second ground trace 1112 of the two ground traces is positioned directly above the second signal trace 1108 within a fourth layer 1164 of the multilayer printed circuit board. The fourth layer 1164 is adjacent to the third layer 1156.

The first signal trace 1106 and second signal trace 1108 connect to a source via 1132 that connects to a common signal source, such as a storage controller. The two ground traces may connect to a first ground via 1134 tied to a lower ground plane, as illustrated. A ground via may in some configurations also connect to an upper ground plane, or separate vias may be used to connect one trace to the lower ground plane and one trace to the upper ground plane. This embodiment is not intended to limit the disclosure with regard to ground via arrangement.

Figure 12B:
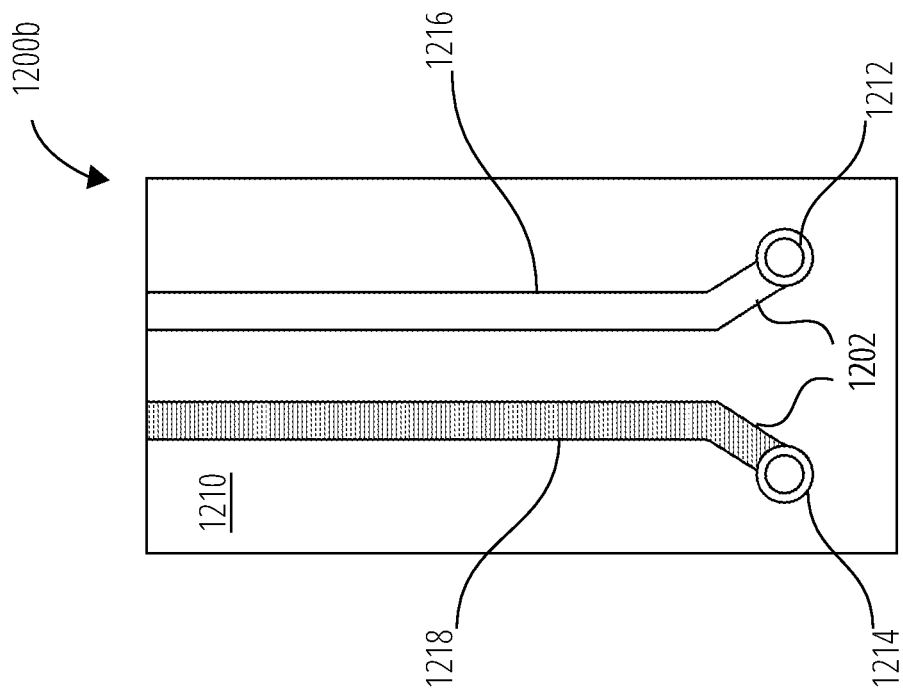
FIG. 12B illustrates a top view of ground traces 1200b in accordance with one embodiment.
Figure 12A:
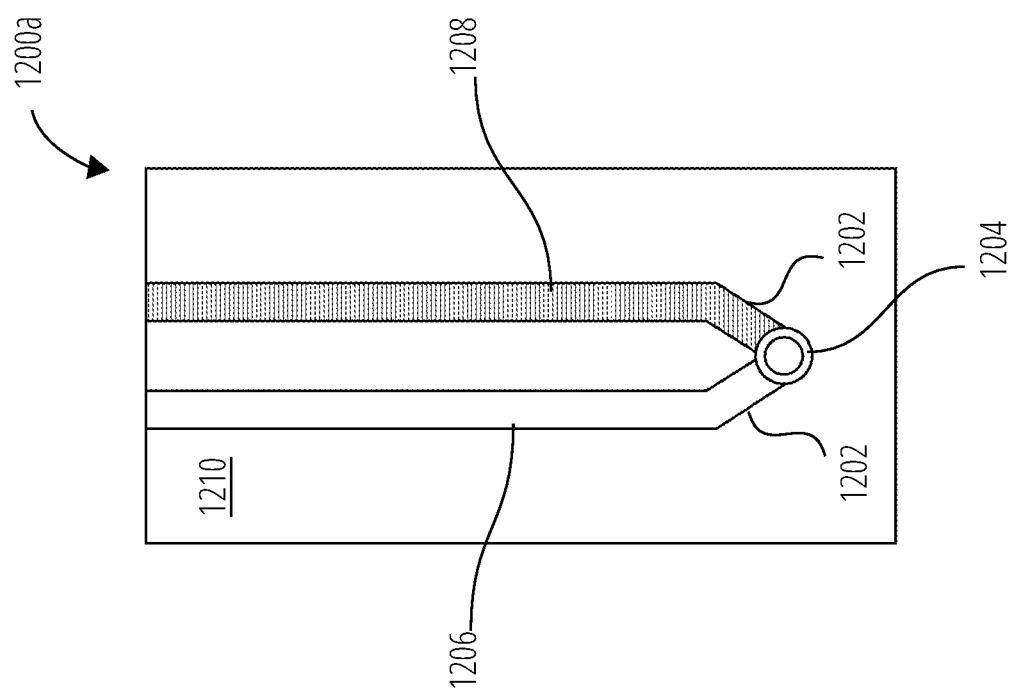
FIG. 12A illustrates a top view of signal traces 1200a in accordance with one embodiment.

FIG. 12A illustrates a top view of two signal traces 1200a in accordance with one embodiment. A first signal trace on first layer 1206 of a printed circuit board 1210 may be routed to a source via to signal source 1204 using an angled connector 1202. A second signal trace on second layer 1208 (shown with cross-hatching because the second layer may be below the first layer) may also be routed to a source via to signal source 1204 (a common signal source) using an angled connector 1202.

"Angled connector" refers to a conductive structure configured to connect to a signal trace horizontally within a layer of a printed circuit board in order to connect the signal trace to a via or other structure.

Each angled connector 1202 may be configured to route a trace horizontally within a layer of the multilayer printed circuit board in order to connect the trace to a via. This may permit the first signal trace on first layer 1206 and second signal trace on second layer 1208 to be configured into a signal compensation structure without interrupting straight-line routing of the traces.

FIG. 12B illustrates a top view of two ground traces 1200b in accordance with one embodiment. The first ground via to ground plane 1212 may connect to a first ground trace on first layer 1216 of the printed circuit board 1210 via an angled connector 1202 as shown. A second ground trace on second layer 1218 (shown with cross-hatching because the second layer may be below the first layer) may connect to a second ground via to ground plane 1214 via angled connector 1202 as well. When used in conjunction with the signal traces 1200a introduced in FIG. 12A, the signal and ground traces routed in this manner may form a signal compensation structure having a cross section such as that introduced in FIG. 11A signal compensation structure 1100a.

Figure 13:
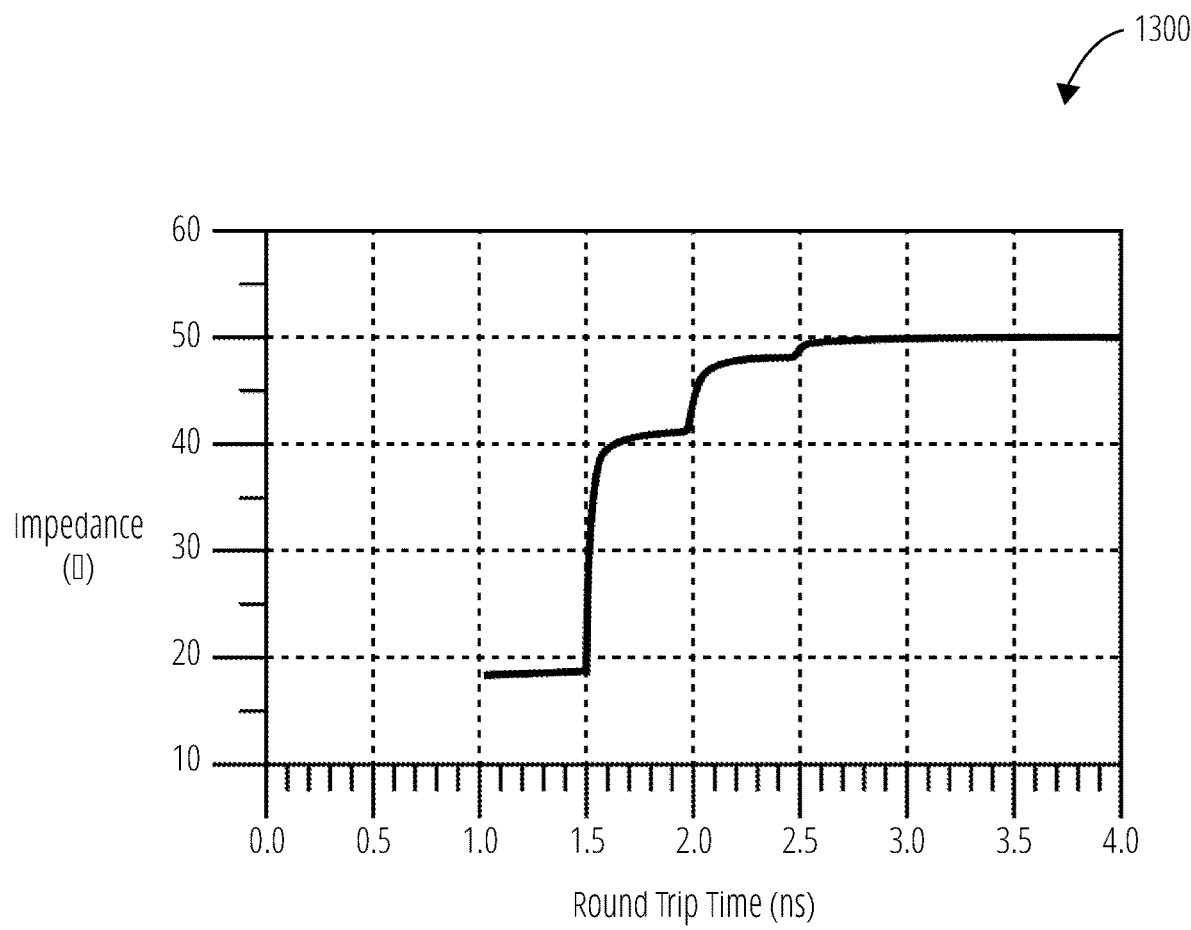
FIG. 13 illustrates a graph of impedance for a signal compensation structure 1300 in accordance with one embodiment.

FIG. 13 illustrates a graph of impedance for a signal compensation structure 1300 in accordance with one embodiment. A characteristic impedance of 50 ohms, such as may be typical of a conventional printed circuit board trace, may result in a signal round trip time from storage controller to memory dies and back, of 2.5 nanoseconds or more. Reducing the impedance of the transmission line, in order to better match impedance along the entire transmission path, through use of a signal compensation structure, may reduce that round trip time as shown. For example, when the impedance is reduced to about 20 ohms, the round trip time may drop to 1.5 nanoseconds, representing a notable improvement. In this manner, improved impedance matching may be considered to effectively reduce the distance the signal travels.

In one embodiment, a first signal source may oscillate at a frequency having a wavelength that is within about ten times the physical length of the transmission path, and the circuit interconnect (which may comprise, or include, an embodiment of the signal compensation structure described herein) may have a characteristic impedance of about 20 ohms. In one embodiment of the claimed solution, a signal compensation structure may comprise a characteristic impedance of less than 40 ohms in response to a signal source oscillating with frequency having a wavelength that is within about ten times the physical length of the transmission path. In another embodiment, the signal compensation structure used in the transmission path may comprise a characteristic impedance of 20 ohms.

Figure 14:
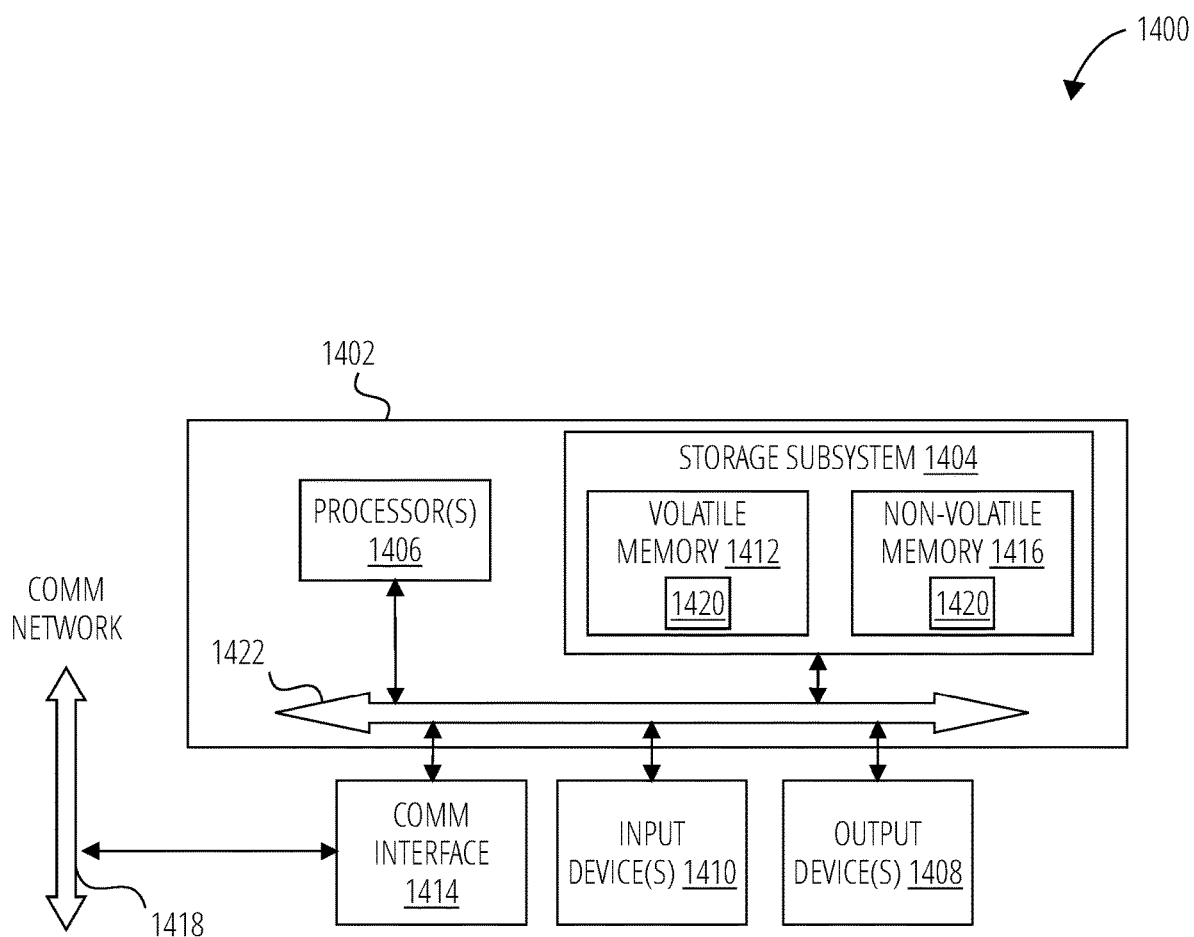
FIG. 14 is an example block diagram of a computing device 1400 that may incorporate certain embodiments.

FIG. 14 is an example block diagram of a computing device 1400 that may incorporate embodiments of the solution. FIG. 14 is merely illustrative of a machine system to carry out aspects of the technical processes described herein and does not limit the scope of the claims. One of ordinary skill in the art would recognize other variations, modifications, and alternatives. In certain embodiments, the computing device 1400 includes a data processing system 1402, a communication network 1418, communication network interface 1414, input device(s) 1410, output device(s) 1408, and the like.

As depicted in FIG. 14, the data processing system 1402 may include one or more processor(s) 1406 and a storage subsystem 1404. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like.

The processor(s) 1406 communicate with a number of peripheral devices via a bus subsystem 1422. These peripheral devices may include input device(s) 1410, output device(s) 1408, communication network interface 1414, and the storage subsystem 1404. The storage subsystem 1404, in one embodiment, comprises one or more storage devices and/or one or more memory devices.

In one embodiment, the storage subsystem 1404 includes a volatile memory 1412 and a non-volatile memory 1416. The volatile memory 1412 and/or the non-volatile memory 1416 may store computer-executable instructions that alone or together form logic 1420 that when applied to, and executed by, the processor(s) 1406 implement embodiments of the processes disclosed herein.

The input device(s) 1410 include devices and mechanisms for inputting information to the data processing system 1402. These may include a keyboard, a keypad, a touch screen incorporated into a graphical user interface, audio input devices such as voice recognition systems, microphones, and other types of input devices. In various embodiments, the input device(s) 1410 may be embodied as a computer mouse, a trackball, a track pad, a joystick, wireless remote, drawing tablet, voice command system, eye tracking system, and the like. The input device(s) 1410 typically allow a user to select objects, icons, control areas, text and the like that appear on a graphical user interface via a command such as a click of a button or the like.

The output device(s) 1408 include devices and mechanisms for outputting information from the data processing system 1402. These may include a graphical user interface, speakers, printers, infrared LEDs, and so on, as well understood in the art. In certain embodiments, a graphical user interface is coupled to the bus subsystem 1422 directly by way of a wired connection. In other embodiments, the graphical user interface couples to the data processing system 1402 by way of the communication network interface 1414. For example, the graphical user interface may comprise a command line interface on a separate computing device 1400 such as desktop, server, or mobile device.

The communication network interface 1414 provides an interface to communication networks (e.g., communication network 1418) and devices external to the data processing system 1402. The communication network interface 1414 may serve as an interface for receiving data from and transmitting data to other systems. Embodiments of the communication network interface 1414 may include an Ethernet interface, a modem (telephone, satellite, cable, ISDN), (asynchronous) digital subscriber line (DSL), Fire-Wire, USB, a wireless communication interface such as Bluetooth or WiFi, a near field communication wireless interface, a cellular interface, and the like.

The communication network interface 1414 may be coupled to the communication network 1418 via an antenna, a cable, or the like. In some embodiments, the communication network interface 1414 may be physically integrated on a circuit board of the data processing system 1402, or in some cases may be implemented in software or firmware, such as "soft modems", or the like.

The computing device 1400 may include logic that enables communications over a network using protocols such as HTTP, TCP/IP, RTP/RTSP, IPX, UDP and the like.

The volatile memory 1412 and the non-volatile memory 1416 are examples of tangible media configured to store computer readable data and instructions to implement various embodiments of the processes described herein. Other types of tangible media include removable memory (e.g., pluggable USB memory devices, mobile device SIM cards), optical storage media, semiconductor memories such as flash memories, non-transitory read-only-memories (ROMS), battery-backed volatile memories, networked storage devices, and the like. The volatile memory 1412 and the non-volatile memory 1416 may be configured to store the basic programming and data constructs that provide the functionality of the disclosed processes and other embodiments thereof that fall within the scope of the present disclosure.

Logic 1420 that implements one or more parts of embodiments of the solution may be stored in the volatile memory 1412 and/or the non-volatile memory 1416. Logic 1420 may be read from the volatile memory 1412 and/or non-volatile memory 1416 and executed by the processor(s) 1406. The volatile memory 1412 and the non-volatile memory 1416 may also provide a repository for storing data used by the logic 1420.

The volatile memory 1412 and the non-volatile memory 1416 may include a number of memories including a main random access memory (RAM) for storage of instructions and data during program execution and a read only memory (ROM) in which read-only non-transitory instructions are stored. The volatile memory 1412 and the non-volatile memory 1416 may include a file storage subsystem providing persistent (non-volatile) storage for program and data files. The volatile memory 1412 and the non-volatile memory 1416 may include removable storage systems, such as removable FLASH memory.

The bus subsystem 1422 provides a mechanism for enabling the various components and subsystems of data processing system 1402 communicate with each other as intended. Although the communication network interface 1414 is depicted schematically as a single bus, some embodiments of the bus subsystem 1422 may utilize multiple distinct busses.

It will be readily apparent to one of ordinary skill in the art that the computing device 1400 may be a device such as a smartphone, a desktop computer, a laptop computer, a rack-mounted computer system, a computer server, or a tablet computer device. As commonly known in the art, the computing device 1400 may be implemented as a collection of multiple networked computing devices. Further, the computing device 1400 will typically include operating system logic (not illustrated) the types and nature of which are well known in the art.

Terms used herein should be accorded their ordinary meaning in the relevant arts, or the meaning indicated by their use in context, but if an express definition is provided, that meaning controls.

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A circuit interconnect, comprising:
   a first ground trace within a first layer of a multilayer printed circuit board;
   a first signal trace positioned adjacent to the first ground trace within the first layer;
   a second ground trace within a second layer of the multilayer printed circuit board, wherein the second ground trace is vertically aligned with the first signal trace;
   a second signal trace adjacent to the second ground trace within the second layer, wherein the second signal trace is vertically aligned with the first ground trace;
   a first source via that connects the first signal trace and the second signal trace to a first signal source;
   a first ground via that connects the first ground trace to a ground source; and
   a second ground via that connects the second ground trace to the ground source, wherein the first source via is positioned between the first ground via and the second ground via.

2. The circuit interconnect of claim 1, further comprising:
   a third ground trace connected to the second ground via and positioned within the second layer and adjacent to the second signal trace;
   a third signal trace connected to a second source via and positioned within the first layer and adjacent to the first ground trace;
   a fourth ground trace connected to a third ground via and positioned within the first layer and adjacent to the third signal trace; and
   a fourth signal trace connected to the second source via and positioned within the second layer and adjacent to the third ground trace, the second source via connected to a second signal source.

3. The circuit interconnect of claim 1, further comprising a third signal trace connected to the first source via and a bonding pad for a pin of a storage controller and a third ground trace connected to the ground source and the first ground via.

4. The circuit interconnect of claim 1, wherein the first signal trace, the second signal trace, the first ground trace, and second the ground trace each comprise an angled connector; and wherein each angled connector is configured to route a trace horizontally within a layer of the multilayer printed circuit board in order to connect the trace to a via.

5. The circuit interconnect of claim 1, wherein the first signal trace and the second signal trace connect to a T-branch connected to an upper bonding pad and a lower bonding pad, the upper bonding pad configured to connect to an upper die stack by way of a first wire bond and the lower bonding pad configured to connect to a lower die stack by way of a second wire bond.

6. The circuit interconnect of claim 1, wherein components of the first signal trace have a wavelength that is within about ten times the physical length of a transmission path that includes the circuit interconnect and the circuit interconnect has a characteristic impedance 20 Ohms.

7. The circuit interconnect of claim 1, wherein the multilayer printed circuit board comprises a ground plane layer connected to the first ground via and an insulation layer that separates the first layer from the second layer.

8. A system, comprising:
a multilayer printed circuit board;
a signal compensation structure integrated with the multilayer printed circuit board, the signal compensation structure comprising a first signal trace coupled to a first signal source, a second signal trace, and two ground traces coupled to a ground source, wherein:
a first ground trace of the two ground traces is positioned within a first layer of the multilayer printed circuit board;
the first signal trace is positioned adjacent to the first ground trace within the first layer;
a second ground trace of the two ground traces is positioned within a second layer and positioned directly above the first signal trace; and
the second signal trace is positioned within the second layer and positioned directly above the first ground trace;
a storage controller coupled to the multilayer printed circuit board and configured to read from, and write data to, a set of memory dies;
a die stack coupled to the multilayer printed circuit board, the die stack comprising the set of memory dies, the set of memory dies connected to each other by a bond wire; and
a communication bus configured to connect the set of memory dies to the storage controller by way of the signal compensation structure.

9. The system of claim 8, wherein the signal compensation structure comprises:
a third signal trace positioned within the first layer and adjacent to the first ground trace;
a third ground trace positioned within the second layer and adjacent to the second signal trace, the third ground trace positioned directly above the third signal trace;
a fourth ground trace positioned within the first layer and adjacent to the third signal trace;
a fourth signal trace positioned within the second layer and adjacent to the third ground trace, the fourth signal trace positioned directly above the fourth ground trace; and
wherein the first signal trace and the second signal trace connect to the first signal source and the third signal trace and the fourth signal trace connect to a second signal source separate and distinct from the first signal source.

10. The system of claim 8, wherein the communication bus comprises a parallel bus comprising a set of transmission lines, each transmission line comprising a signal compensation structure.

11. A system, comprising:
a multilayer printed circuit board;
a signal compensation structure integrated with the multilayer printed circuit board, the signal compensation structure comprising a first signal trace coupled to a first signal source and two ground traces coupled to a ground source, wherein:
a first ground trace of the two ground traces is positioned within a first layer of the multilayer printed circuit board and the first signal trace is positioned directly above the first ground trace in a second layer of the multilayer printed circuit board, the second layer adjacent to the first layer; and
a second ground trace of the two ground traces is positioned directly above the first signal trace within a third layer of the multilayer printed circuit board, the third layer adjacent to the second layer;
a storage controller coupled to the multilayer printed circuit board and configured to read from, and write data to, a set of memory dies;
a die stack coupled to the multilayer printed circuit board, the die stack comprising the set of memory dies, the set of memory dies connected to each other by a bond wire; and
a communication bus configured to connect the set of memory dies to the storage controller by way of the signal compensation structure.

12. A system, comprising:
a multilayer printed circuit board;
a signal compensation structure integrated with the multilayer printed circuit board, the signal compensation structure comprising a first signal trace coupled to a first signal source and two ground traces coupled to a ground source, wherein:
the first signal trace is positioned between the two ground traces within a first layer of the multilayer printed circuit board;
a first ground trace of the two ground traces is positioned directly above the first signal trace and within a second layer above and adjacent to the first layer, and
a second ground trace of the two ground traces is positioned directly below the first signal trace and within a third layer below and adjacent to the first layer;
a storage controller coupled to the multilayer printed circuit board and configured to read from, and write data to, a set of memory dies;
a die stack coupled to the multilayer printed circuit board, the die stack comprising the set of memory dies, the set of memory dies connected to each other by a bond wire; and
a communication bus configured to connect the set of memory dies to the storage controller by way of the signal compensation structure.

13. A system, comprising:
a multilayer printed circuit board;
a signal compensation structure integrated with the multilayer printed circuit board, the signal compensation structure comprising a first signal trace coupled to a first signal source, a second signal trace, and two ground traces coupled to a ground source, wherein:
a first ground trace of the two ground traces is positioned within a first layer of the multilayer printed circuit board;
the first signal trace is positioned directly above the first ground trace in a second layer of the multilayer printed circuit board, the second layer adjacent to the first layer;
the second signal trace is positioned directly above the first signal trace and within a third layer above and adjacent to the second layer;
a second ground trace of the two ground traces is positioned directly above the second signal trace within a fourth layer of the multilayer printed circuit board, the fourth layer adjacent to the third layer; and the first signal trace and the second signal trace connect to a source via that connects to a common signal source;
a storage controller coupled to the multilayer printed circuit board and configured to read from, and write data to, a set of memory dies;
a die stack coupled to the multilayer printed circuit board, the die stack comprising the set of memory dies, the set of memory dies connected to each other by a bond wire; and
a communication bus configured to connect the set of memory dies to the storage controller by way of the signal compensation structure.

14. A signal compensation structure, comprising:
a first ground trace coupled to a lower ground plane of a multilayer printed circuit board by a first ground via, the multilayer printed circuit board comprising a substrate, a first layer, a second layer, the lower ground plane, and an upper ground plane, the multilayer printed circuit board further comprising an insulation layer between each of the lower ground plane and the first layer, the first layer and the second layer, and the second layer and the upper ground plane;
a first signal trace adjacent to the first ground trace within the first layer and coupled to a signal source;
a second ground trace coupled to the upper ground plane by a second ground via; and
a second signal trace adjacent to the second ground trace within the second layer and coupled to the signal source by a source via connected to the first signal trace, wherein:
the source via is positioned between the first ground via and the second ground via;
the second layer is positioned above the first layer;
the first signal trace and the second signal trace connect to a T-branch connected to an upper bonding pad and a lower bonding pad, the upper bonding pad configured to connect to an upper die stack by way of a first wire bond and the lower bonding pad configured to connect to a lower die stack by way of a second wire bond; and
the upper die stack comprises more than four memory dies and the lower die stack comprises more than four memory dies.

15. A signal compensation structure, comprising:
a first ground trace coupled to a lower ground plane of a multilayer printed circuit board by a first ground via, the multilayer printed circuit board comprising a substrate, a first layer, a second layer, the lower ground plane, and an upper ground plane, the multilayer printed circuit board further comprising an insulation layer between each of the lower ground plane and the first layer, the first layer and the second layer, and the second layer and the upper ground plane;

a first signal trace adjacent to the first ground trace within the first layer and coupled to a signal source;
a second ground trace coupled to the upper ground plane by a second ground via; and
a second signal trace adjacent to the second ground trace within the second layer and coupled to the signal source by a source via connected to the first signal trace, wherein:
the source via is positioned between the first ground via and the second ground via;
the second layer is positioned above the first layer;
the signal compensation structure is part of a transmission path and the signal compensation structure is configured to connect to a third signal trace connected to the source via and a bonding pad for a pin of a storage controller and a third ground trace connected to one of the upper ground plane, the lower ground plane, and one of the first ground via and the second ground via; and
the third ground trace is positioned within the first layer of the multilayer printed circuit board and the third signal trace comprises a characteristic impedance of 50 Ohms in response to components of the signal source having a wavelength that is within about ten times the physical length of the transmission path.

16. A signal compensation structure, comprising:
a first ground trace coupled to a lower ground plane of a multilayer printed circuit board by a first ground via, the multilayer printed circuit board comprising a substrate, a first layer, a second layer, the lower ground plane, and an upper ground plane, the multilayer printed circuit board further comprising an insulation layer between each of the lower ground plane and the first layer, the first layer and the second layer, and the second layer and the upper ground plane;
a first signal trace adjacent to the first ground trace within the first layer and coupled to a signal source;
a second ground trace coupled to the upper ground plane by a second ground via; and
a second signal trace adjacent to the second ground trace within the second layer and coupled to the signal source by a source via connected to the first signal trace, wherein:
the source via is positioned between the first ground via and the second ground via;
the second layer is positioned above the first layer; and
the signal compensation structure comprises a characteristic impedance of less than 40 Ohms in response to components of the signal source having a wavelength that is within about ten times the physical length of the transmission path.

17. The signal compensation structure of claim 16, wherein the signal compensation structure comprises a characteristic impedance of 20 Ohms.

* * * * *